(12) United States Patent
Kim et al.

(10) Patent No.: US 7,872,290 B2
(45) Date of Patent: *Jan. 18, 2011

(54) RECESS TRANSISTOR (TR) GATE TO OBTAIN LARGE SELF-ALIGNED CONTACT (SAC) OPEN MARGIN

(75) Inventors: Ji-Young Kim, Yongin (KR); Jin-Jun Park, Seoul (KR)

(73) Assignee: Samsung Electronics Co., Ltd., Suwon, Kyungki-do (KR)

(*) Notice: Subject to any disclaimer, the term of this patent is extended or adjusted under 35 U.S.C. 154(b) by 510 days.

This patent is subject to a terminal disclaimer.

(21) Appl. No.: 11/503,130

(22) Filed: Aug. 14, 2006

(65) Prior Publication Data
US 2007/0069265 A1    Mar. 29, 2007

Related U.S. Application Data

(63) Continuation of application No. 10/682,492, filed on Oct. 10, 2003, now Pat. No. 7,091,540.

(30) Foreign Application Priority Data
Apr. 2, 2003    (KR) .............................. 2003-20785

(51) Int. Cl.
*H01L 27/108* (2006.01)
(52) U.S. Cl. .................... 257/300; 257/296; 257/390; 257/393; 257/E21.661
(58) Field of Classification Search .................. 257/300
See application file for complete search history.

(56) References Cited

U.S. PATENT DOCUMENTS

| | | | |
|---|---|---|---|
| 5,398,205 A | 3/1995 | Yamaguchi | |
| 5,732,009 A | 3/1998 | Tadaki et al. | |
| 5,828,096 A | 10/1998 | Ohno et al. | |
| 5,917,211 A * | 6/1999 | Murata et al. | 257/296 |
| 6,037,194 A | 3/2000 | Bronner et al. | |
| 6,063,669 A | 5/2000 | Takaishi | |
| 6,188,095 B1 | 2/2001 | Hieke | |
| 6,218,697 B1 * | 4/2001 | Minn | 257/306 |
| 6,300,655 B1 | 10/2001 | Ema et al. | |
| 6,339,239 B1 | 1/2002 | Alsmeier et al. | |
| 6,362,506 B1 | 3/2002 | Miyai | |

(Continued)

FOREIGN PATENT DOCUMENTS

DE    39 05 634 A1    8/1989

(Continued)

*Primary Examiner*—Kenneth A Parker
*Assistant Examiner*—Jose R Diaz
(74) *Attorney, Agent, or Firm*—Lee & Morse, P.C.

(57) ABSTRACT

A memory cell of a semiconductor device and a method for forming the same, wherein the memory cell includes a substrate having active regions and field regions, a gate layer formed over the substrate, the gate layer including a plurality of access gates formed over the active regions of the substrate and a plurality of pass gates formed over the field regions of the substrate, first self-aligned contact regions formed between adjacent pass gates and access gates, and second self-aligned contact regions formed between adjacent access gates, wherein a width of each of the first self-aligned contact regions is larger than a width of each of the second self-aligned contact regions.

15 Claims, 34 Drawing Sheets

U.S. PATENT DOCUMENTS

| | | |
|---|---|---|
| 6,457,163 B1 | 9/2002 | Yang |
| 6,462,368 B2 | 10/2002 | Torii et al. |
| 6,483,140 B1 | 11/2002 | Matsuoka et al. |
| 6,770,535 B2 | 8/2004 | Yamada et al. |
| 7,091,540 B2 * | 8/2006 | Kim et al. .................. 257/296 |
| 2002/0073394 A1 | 6/2002 | Milor et al. |
| 2003/0027395 A1 | 2/2003 | Park et al. |
| 2003/0030090 A1 | 2/2003 | Sasaki |

FOREIGN PATENT DOCUMENTS

| | | |
|---|---|---|
| JP | 63-170955 A | 7/1988 |
| JP | 04-014253 A | 1/1992 |
| JP | 05-291526 | 5/1993 |
| JP | 06-318680 A | 11/1994 |
| JP | 09-237897 A | 9/1997 |
| JP | 2000-036594 | 2/2000 |
| JP | 2000-91524 | 3/2000 |
| JP | 2001-210801 A | 8/2001 |

* cited by examiner

US 7,872,290 B2

RECESS TRANSISTOR (TR) GATE TO OBTAIN LARGE SELF-ALIGNED CONTACT (SAC) OPEN MARGIN

CROSS REFERENCE TO RELATED APPLICATION(S)

This is a continuation application based on application Ser. No. 10/682,492, filed Oct. 10, 2003, now U.S. Pat. No. 7,091,540, the entire contents of which is hereby incorporated by reference.

BACKGROUND OF THE INVENTION

1. Field of the Invention

The present invention relates to a recess transistor (TR) gate in a semiconductor device. More particularly, the present invention relates to a recess transistor gate having increased space between adjacent recess gates and a method of forming the same.

2. Description of the Related Art

In order to achieve higher density, conventional dynamic random access memory (DRAM) cells utilize a storage capacitor and an insulated gate field effect transistor (FET). DRAM cells have been successively scaled down in size to the sub-micron range. However, as a result of this reduction in size, there are many challenges in designing a planar gate. As the width of the planar gate narrows accompanied with shorter channels, problems such as junction leakage, source/drain breakdown voltage, and data retention time become issues of concern. Efforts to increase the density and the required gate channel length have led to the development of a recess gate being formed within a silicon substrate. Conventionally, a width of a planar gate on an active region, i.e., an access gate, is larger than a width of a planar gate on a field region, i.e., a pass gate. The narrow space between the gates gives rise to a self-aligned contact (SAC) open margin problem.

FIG. 1 illustrates a plan view of a conventional DRAM cell gate layout according to the prior art.

In FIG. 1, a substrate (not shown) includes an active region 10 and a field region 18. A gate layer 12 is formed over the substrate to intersect the active region 10. An access gate 12a is formed over each intersection of the gate layer 12 and the active region 10. Reference character $W_1$ represents a width of an access gate 12a. A pass gate 12b is formed over each intersection of the gate layer 12 and the field region 18. Reference character $W_2$ represents a width of a pass gate 12b.

A BC SAC region 14 is formed at a periphery of the active region 10. Reference character $d_1$ represents a distance between an access gate and an adjacent pass gate, i.e., a size of the BC SAC region. A DC SAC region 16 is formed at a center of the active region 10. Reference character $d_2$ represents a distance between adjacent access gates, i.e., a size of the DC SAC region. In this conventional arrangement, the width $W_1$ of an access gate 12a is designed to be larger than the width $W_2$ of a pass gate 12b.

Thus, as may be seen in this conventional planar gate structure, the width $W_1$ of the access gate 12a is larger than the width $W_2$ of a pass gate 12b. Conventionally, it is necessary that the width $W_1$ of the access gate 12a be larger than the width $W_2$ of the pass gate 12b in order to increase the refresh time in the planar type gate. This arrangement, however, leads to the self-aligned contact (SAC) open margin problem as described above.

SUMMARY OF THE INVENTION

In an effort to overcome at least some of the problems described above, the present invention forms a recess type gate having increased space between adjacent recess gates.

It is a feature of an embodiment of the present invention to provide a memory cell of a semiconductor device including a substrate having active regions and field regions, a gate layer formed over the substrate, the gate layer including a plurality of access gates formed over the active regions of the substrate and a plurality of pass gates formed over the field regions of the substrate, first self-aligned contact regions formed between adjacent pass gates and access gates, and second self-aligned contact regions formed between adjacent access gates, wherein a width of each of the first self-aligned contact regions is larger than a width of each of the second self-aligned contact regions.

In the memory cell, the width of each of the first self-aligned contact regions may be made larger than the width of each of the second self-aligned contact regions by each one of the plurality of access gates having a width smaller than a width of an adjacent pass gate. The width of each of the plurality of access gates may be decreased by a notch formed on at least one side of each of the plurality of access gates.

In a preferred embodiment of the present invention, the notch formed on at least one side of each of the plurality of access gates is formed adjacent to the first self-aligned contact region so as to face one of the plurality of pass gates.

In another embodiment of the present invention, the notch formed on at least one side of each of the plurality of access gates is formed adjacent to the second self-aligned contact region so as to face one of the plurality of access gates.

In still another embodiment of the present invention, each of the plurality of access gates has a pair of notches, each notch formed on opposing sides of each of the plurality of access gates.

In yet another embodiment of the present invention, sidewall spacers may be formed on sidewalls of each of the plurality of access gates and each of the plurality of pass gates. In addition, a recess hole may be formed having an opening and a bottom for receiving one of the plurality of access gates, wherein a width of the opening of the recess hole is larger than a width of the bottom of the recess hole. Further, the sidewall spacers formed on sidewalls of the plurality of access gates may extend below an upper surface of the substrate.

It is another feature of an embodiment of the present invention to provide a method of forming a memory cell of a semiconductor memory device including forming an isolation region and an active region on a substrate, performing an ion implantation to form a source/drain region in the substrate, forming a recess gate hole by etching the substrate in the active region, forming a gate oxide layer on the active region of the substrate, forming a gate layer and a gate mask layer sequentially on the entire surface of the substrate, and etching the gate layer and the gate mask layer to form a plurality of access gates on the active region of the substrate and a plurality of pass gates on the field region of the substrate and to form a notch in each of the plurality of access gates so that a width of each of the plurality of access gates is narrower than a width of each of the pass gates, to thereby form a first self-aligned contact region between adjacent pass gates and access gates and a second self-aligned contact region between adjacent access gates, whereby a width of the first self-aligned contact region is larger than a width of the second self-aligned contact region.

The method may further include forming sidewall spacers on sidewalls of each of the plurality of access gates and each of the plurality of pass gates.

In the method, forming a recess gate hole by etching the substrate in the active region may include etching the substrate to form a recess gate hole having an opening and a bottom, wherein a width of the opening of the recess hole is larger than a width of the bottom of the recess hole. The method may further include forming sidewall spacers on sidewalls of each of the plurality of access gates and each of the plurality of pass gates, wherein the sidewall spacers formed on sidewalls of the plurality of access gates extend below an upper surface of the substrate.

The method may further include forming an interlayer dielectric layer over the sidewall spacer formed on the sidewall of one of the plurality of pass gates and the field region of the substrate.

In the method, forming the notch may include forming the notch on at least one side of each of the plurality of access gates adjacent to the first self-aligned contact region so as to face one of the plurality of pass gates, or may include forming the notch on at least one side of each of the plurality of access gates adjacent to the second self-aligned contact region so as to face one of the plurality of access gates, or may include forming a pair of notches in each of the plurality of access gates, each notch being formed on opposing sides of each of the plurality of access gates.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
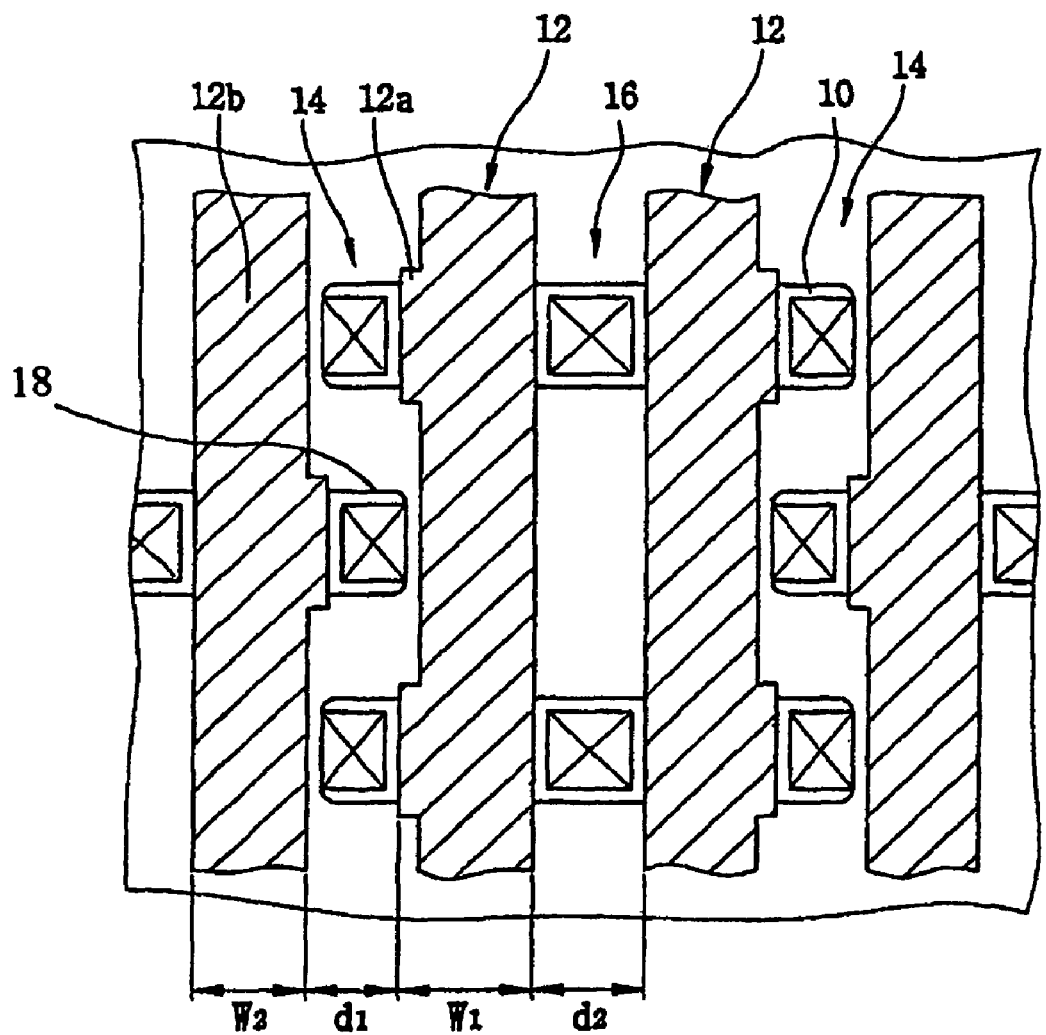
FIG. 1 illustrates a plan view of a conventional DRAM cell gate layout according to the prior art.

The present invention will now be described more fully hereinafter with reference to the accompanying drawings, in which preferred and alternate embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals and characters refer to like elements throughout.

Preferred Embodiment

Figure 2:
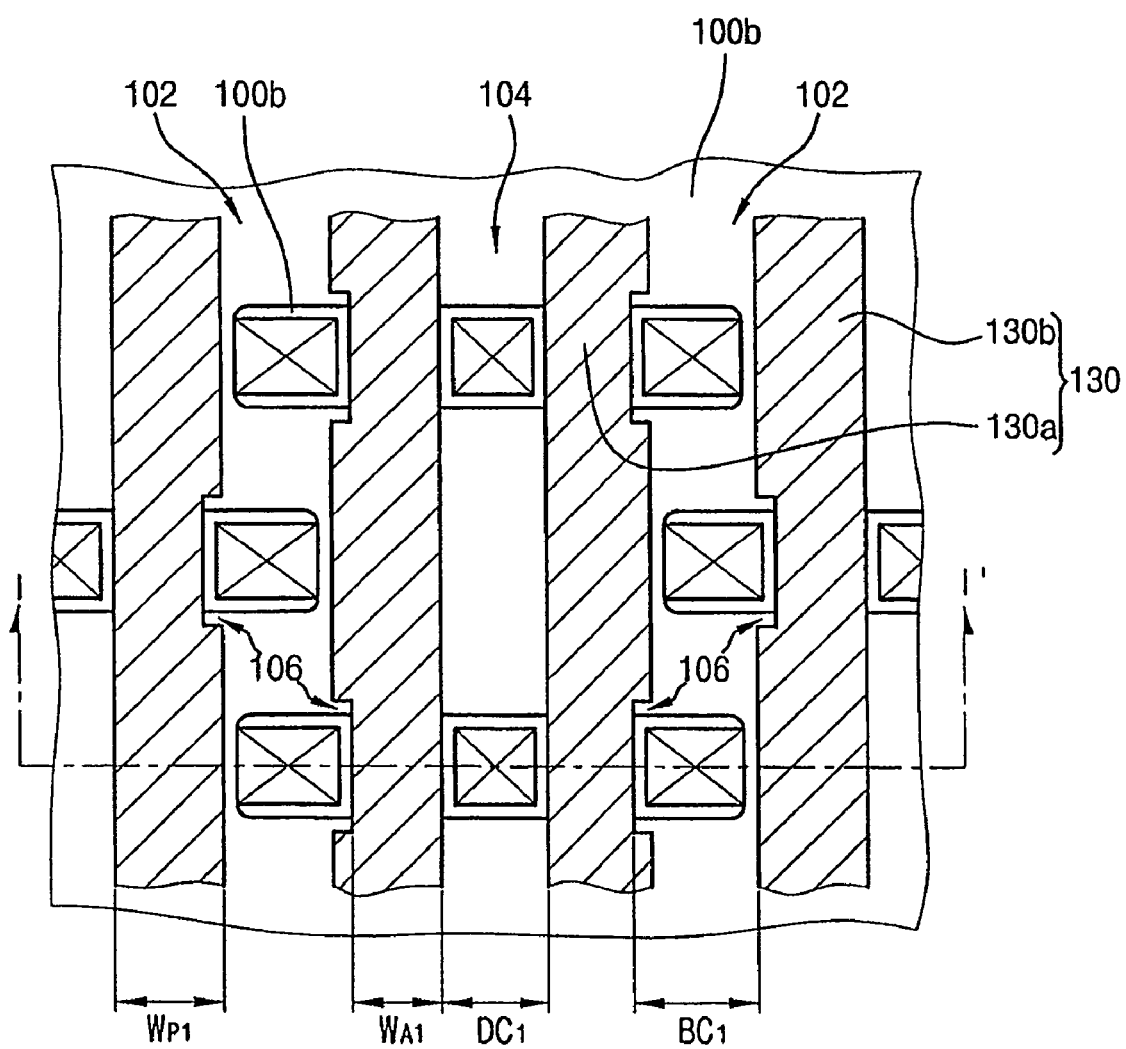
FIG. 2 illustrates a plan view of a DRAM cell gate layout according to a preferred embodiment of the present invention.
Figure 3:
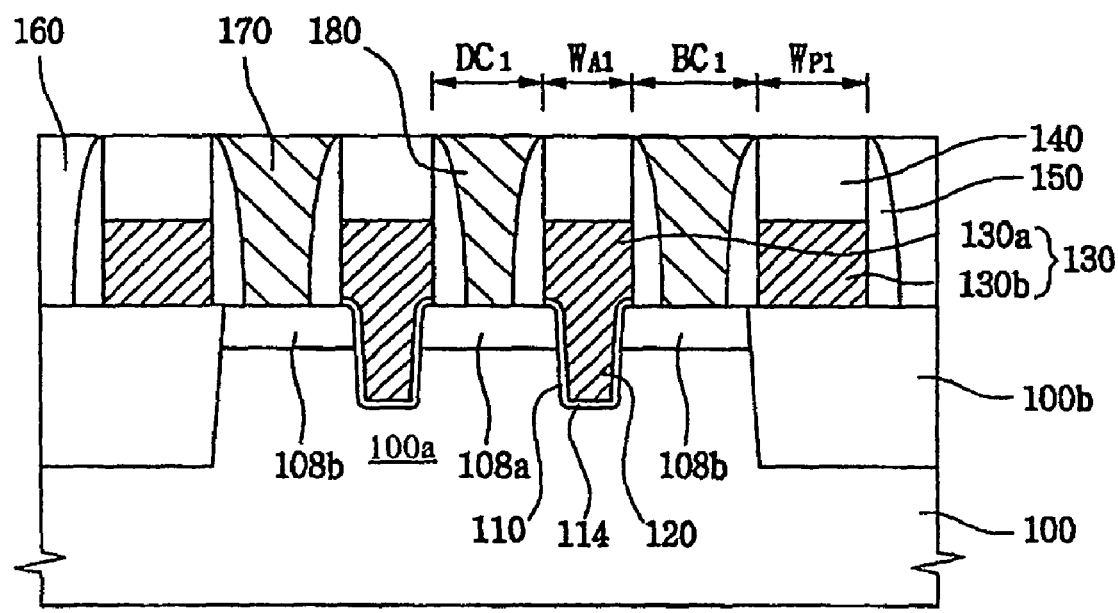
FIG. 3 illustrates a cross-sectional view taken along line I-I' of FIG. 2.

FIG. 2 illustrates a plan view of a DRAM cell gate layout according to a preferred embodiment of the present invention. FIG. 3 illustrates a cross-sectional view taken along line I-I' of FIG. 2. FIGS. 4A-4G illustrate stages in a method of forming the DRAM cell gate layout as shown in FIGS. 2 and 3.

Referring to FIG. 2, a substrate (100 of FIG. 3) includes an active region 100a and a field region 100b. A gate layer 130 is formed over the substrate to intersect the active region 100a. The gate layer 130 includes an access gate 130a and a pass gate 130b. An access gate 130a is formed over each intersection of the gate layer 130 and the active region 100a. Reference character $W_{A1}$ represents a width of an access gate 130a. A pass gate 130b is formed over each intersection of the gate layer 130 and the field region 100b. Reference character $W_{P1}$ represents a width of a pass gate 130b.

A BC SAC region 102 is formed at a periphery of the active region 100a. Reference character $BC_1$ represents a distance between an access gate 130a and an adjacent pass gate 130b in the BC SAC region. A DC SAC region 104 is formed at a center of the active region 100a. Reference character $DC_1$ represents a distance between adjacent access gates 130a in the DC SAC region.

The distance $BC_1$ is made larger than the distance $DC_1$ by decreasing a width of the access gates by etching notches 106 in the sides of the access gates 130a adjacent to the BC SAC region 102. Preferably, notches 106 are etched only on a side of an access gate facing a pass gate, i.e., in the BC SAC region 102. The notches 106 preferably have a depth of between about 10-20 nm.

FIG. 3 illustrates a cross-sectional view taken along line I-I' of FIG. 2. In FIG. 3, a pair of access gates 130a and a pair of pass gates 130b are formed on an active region 100a and a field region 100b of a substrate 100, respectively. The substrate 100 includes a source region 108a and drain regions 108b. The active region of the substrate includes a pair of recess holes 110 each formed at a location corresponding to one of the access gates 130a. Each recess hole 110 is coated with a gate oxide layer 114 and filled with a gate poly layer 120. Sidewall spacers 150 are formed on sidewalls of the access gates 130a and the pass gates 130b and a gate mask 140, which is formed on the access gates 130a and the pass gates 130b.

An interlayer dielectric (ILD) oxide 160 is deposited over the field region 100b of the substrate 100. A BC SAC 170 is formed in an opening between an access gate 130a and a pass gate 130b and a DC SAC 180 is formed in an opening between adjacent access gates 130a.

Table 1 is a comparison of critical dimensions of the prior art with the present invention. The width of the access gate $W_{A1}$, i.e., access gate size, of the present invention is smaller than that in the prior art, however the width of the pass gate $W_{P1}$, i.e., the pass gate size, is larger, thereby decreasing the word line resistance. In the present invention, both the size of the BC SAC region $BC_1$ and the size of the DC SAC region $DC_1$ are larger than in the prior art. Accordingly, in the present invention, the word line resistance is smaller than in the prior art because a pass gate size $W_{P1}$ in the present invention is larger than in the prior art. Further, as the sizes of the BC SAC region $BC_1$ and the DC SAC region $DC_1$ increase, a SAC open margin improves.

TABLE 1

| Element | $W_A$ Access gate size | $W_P$ Pass gate size | BC BC SAC size | DC DC SAC size |
|---|---|---|---|---|
| Prior art | 100 nm | 60 nm | 55 nm | 50 nm |
| Present invention | 70 nm | 80 nm | 63 nm | 57 nm |
|  | 60 nm | 80 nm | 74 nm | 66 nm |

Preferably, a ratio of BC SAC region/DC SAC region is a range of approximately 1 to 1.2. Most preferably, the ratio is about 1.1, which ratio may be called the golden ratio. A ratio of less than about 1.0 does not satisfy the invention as the BC SAC region is too small. A ratio of greater than about 1.2 is similarly unworkable as the DC SAC region becomes too small to form a contact.

A method of forming the DRAM cell gate layout according to the preferred embodiment of the present invention will now be described with reference to FIGS. 4A-4G.

Figure 4A:
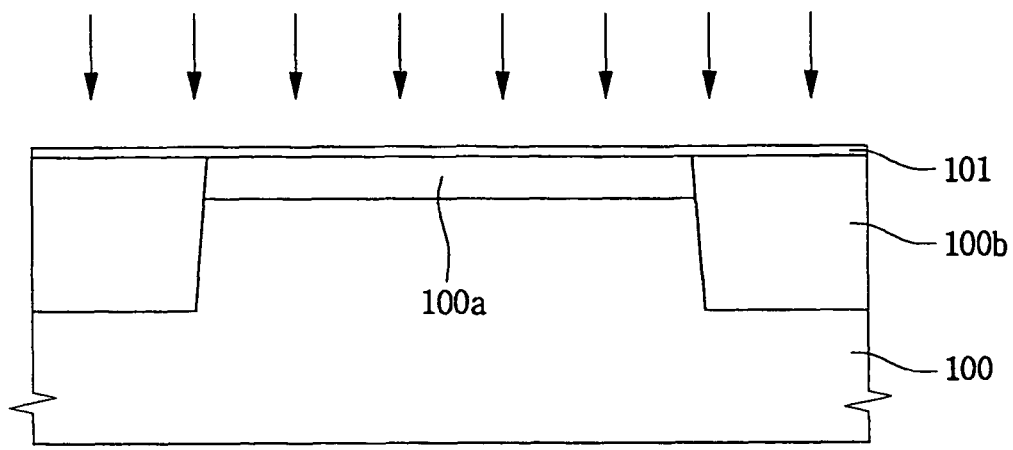
FIGS. 4A-4G illustrate stages in a method of forming the DRAM cell gate layout as shown in FIGS. 2 and 3.

FIG. 4A illustrates a substrate 100 having an active region 100a and a field region 100b for forming a shallow trench isolation (STI) region. A first oxide layer 101 is then formed on the active 100a and field 100b regions of the substrate 100. An ion implantation (shown by arrows) is then preformed to form source/drain regions in the substrate 100.

Figure 4B:
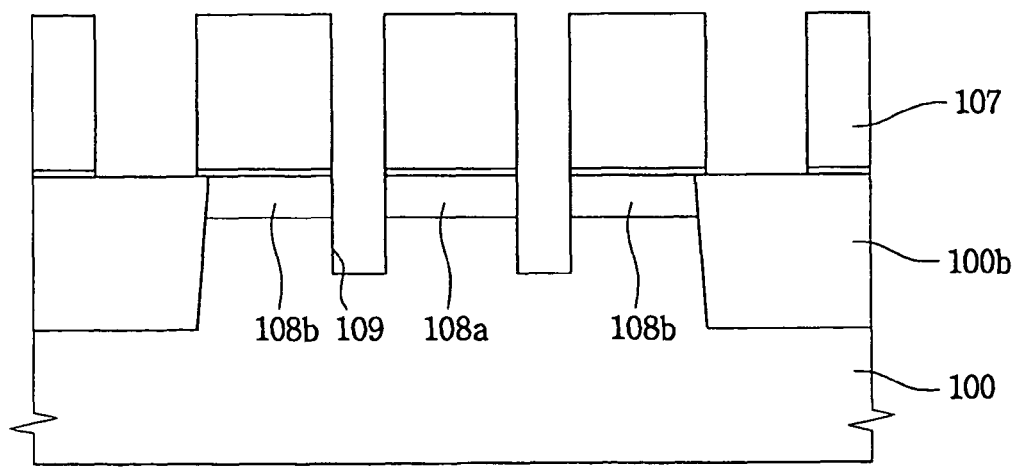

Referring to FIG. 4B, a second oxide layer 107 is formed on the first oxide layer 101. An etching process is then performed to form a series of gate trenches 109 to serve as gate contacts.

Figure 4C:
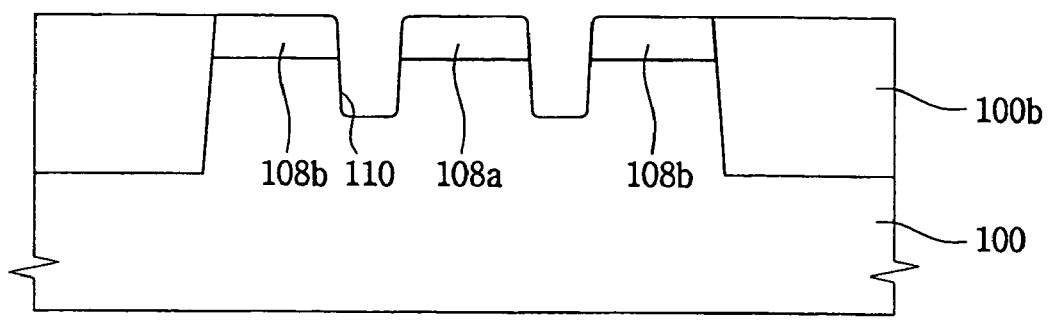

Referring to FIG. 4C, after formation of the gate trenches 109, the second oxide layer 107 and the first oxide layer 101 are removed from the surface of the substrate 100. Recess gate holes 110 are then formed in the active region 100a of the substrate 100 between the source region 108a and the drain regions 108b, respectively, of the substrate 100.

Figure 4D:
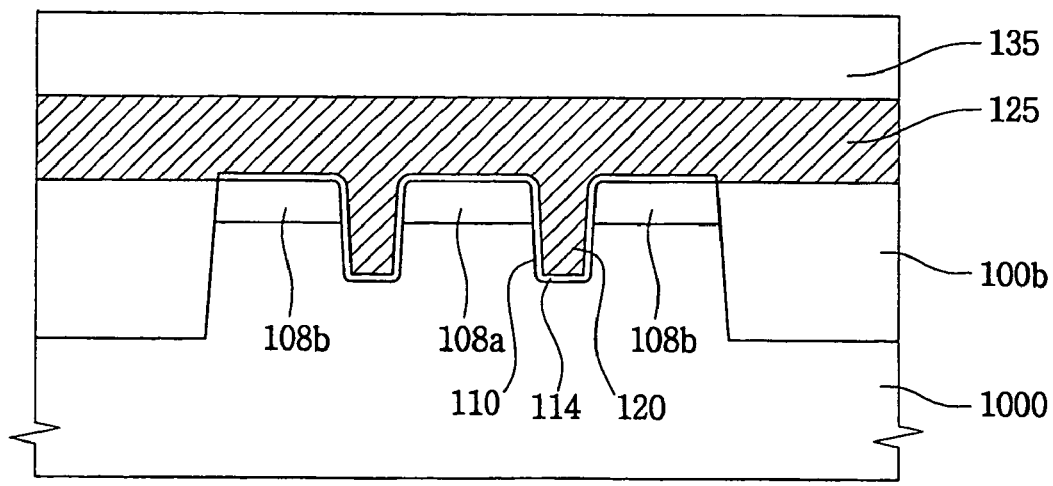

Referring to FIG. 4D, a gate oxide layer 114 is formed on the active region 100a of the substrate 100. The gate oxide layer 114 covers an upper surface of the active region 100a of the substrate 100 and interior surfaces of the recess gate holes 110. A gate poly layer 125 and a gate mask layer 135 are then sequentially formed on the gate oxide layer 114 and on the field region 100b of the substrate 100.

Figure 4E:
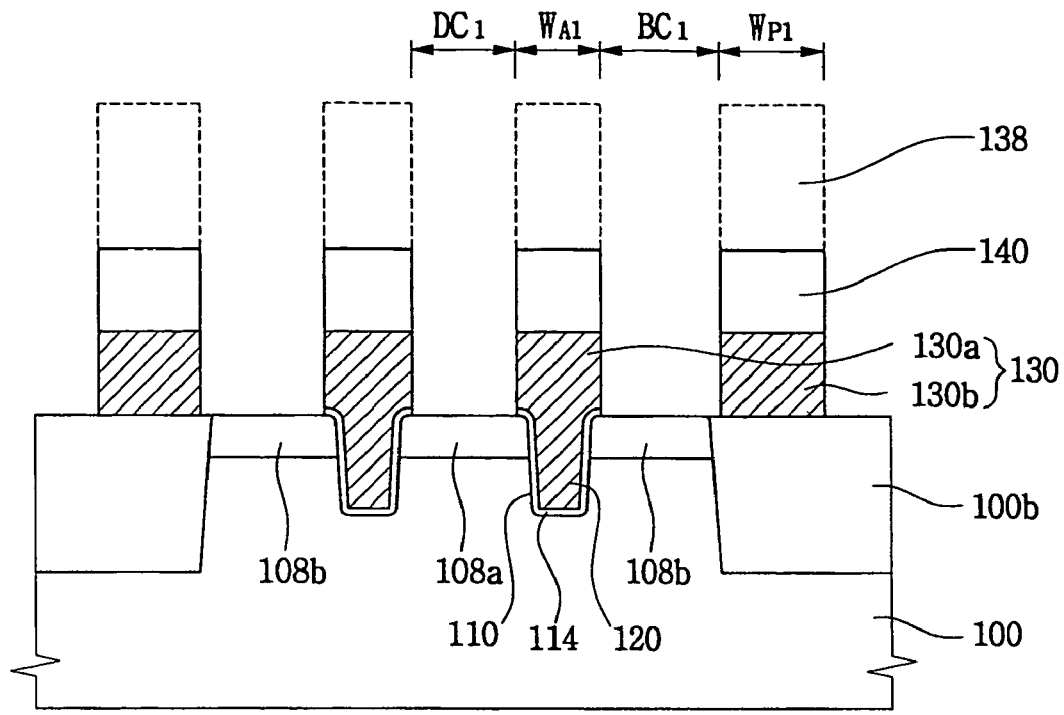

Referring to FIG. 4E, a photoresist layer 138 is formed on the gate poly layer 125 and the gate mask layer 135. The gate poly layer 125 and the gate mask layer 135 are then etched to form access gates 130a and gate masks 140 over the active region 100a of the substrate 100 and pass gates 130b and gate masks 140 over the field region 100b of the substrate 100. Reference characters $W_A$ and $W_P$ represent widths of an access gate and a pass gate, respectively. Reference character BC represents a distance between an access gate and a pass gate. Reference character DC represents a distance between adjacent access gates.

Figure 4F:
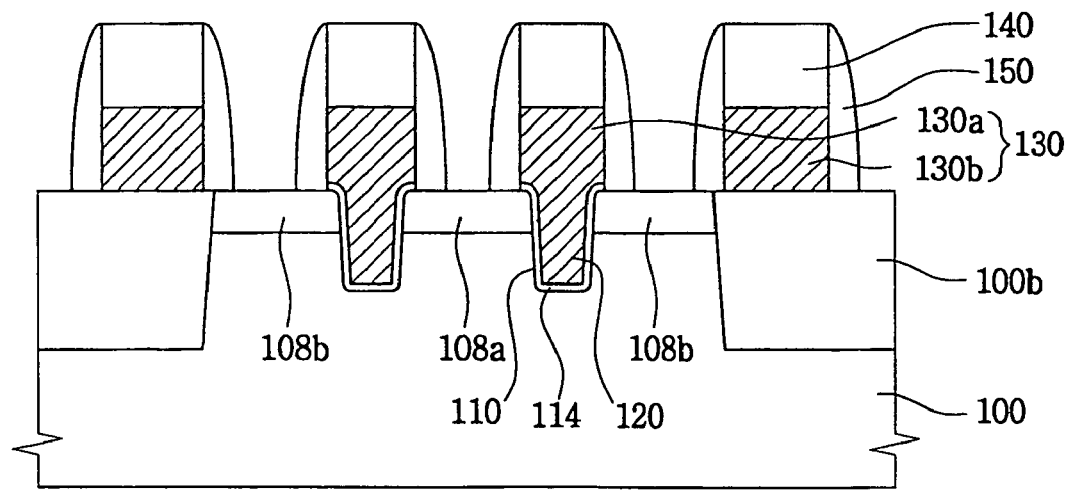

Referring to FIG. 4F, an insulation layer (not shown) is formed on the access gates 130a and the pass gates 130b and the substrate 100 by a chemical vapor deposition (CVD) process. The insulation layer is then etched to form sidewall spacers 150 on sidewalls of the access gates and the pass gates.

Figure 4G:
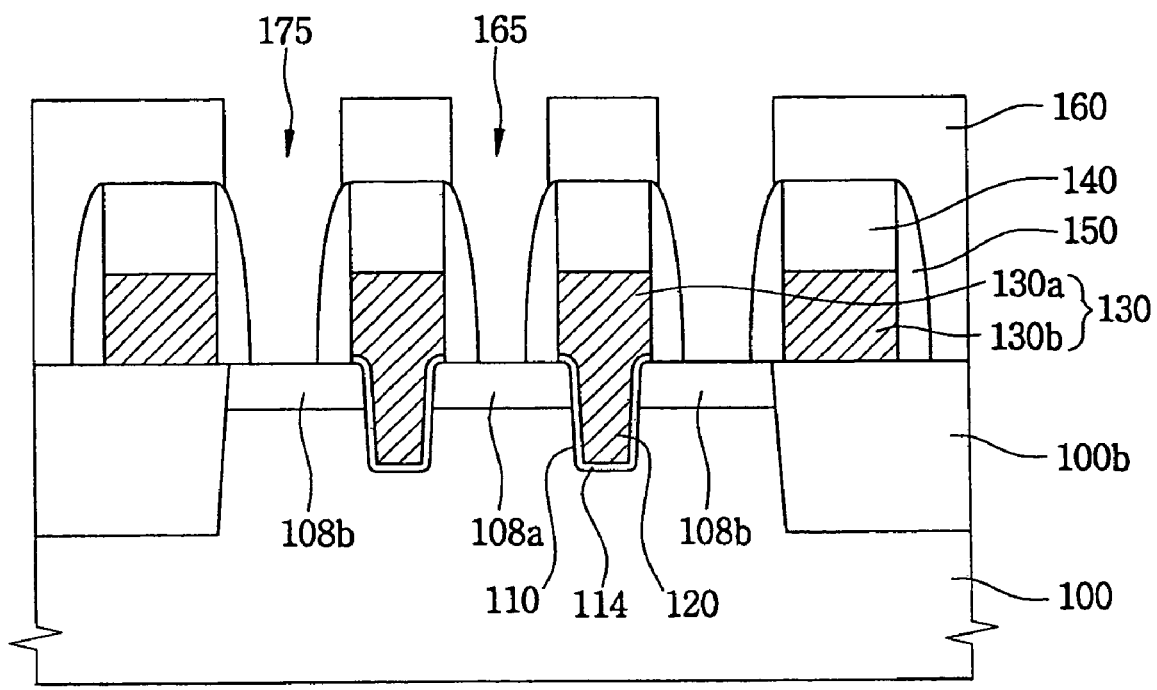

Referring to FIG. 4G, an interlayer dielectric (ILD) oxide 160 is deposited on the access gates 130a and the pass gates 130b and the substrate 100. The interlayer dielectric (ILD) oxide 160 is then etched to form an opening 165 over the active region 100a of the substrate 100 between adjacent access gates 130a and openings 175 over the active region 100a of the substrate 100 between the access gate 130a and the pass gate 130b. The opening 175 between an access gate 130a and a pass gate 130b forms the BC SAC (170 of FIG. 3). The opening 165 between adjacent access gates 130a forms the DC SAC (180 of FIG. 3). The interlayer dielectric (ILD) oxide 160, the BC SAC 170, and the DC SAC 180 are then planarized to achieve the resultant structure as shown in FIG. 3.

Alternate Preferred Embodiment

Figure 5:
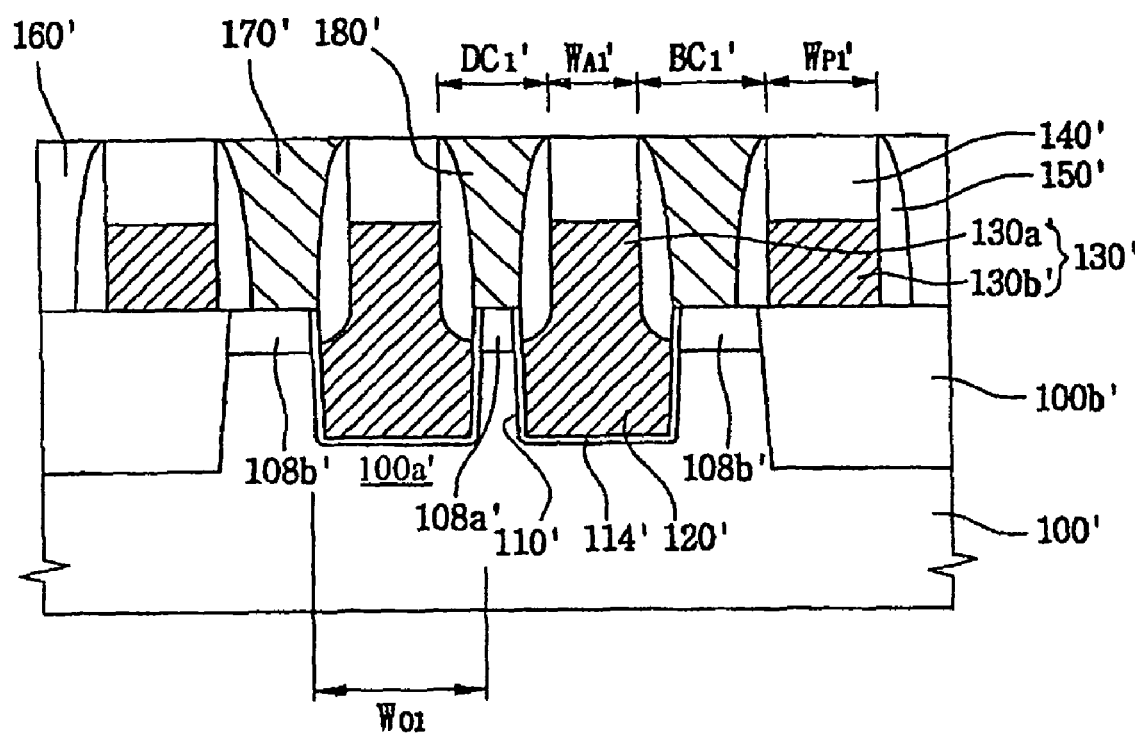
FIG. 5 illustrates an alternate embodiment of the preferred embodiment as shown in FIGS. 2 and 3.

FIG. 5 illustrates an alternate embodiment of the preferred embodiment as shown in FIGS. 2 and 3. FIGS. 6A-6G illustrate stages in a method of forming the DRAM cell gate layout as shown in FIG. 5.

In FIG. 5, a pair of access gates 130a' and a pair of pass gates 130b' are formed on an active region 100a' and a field region 100b' of a substrate 100', respectively. The substrate 100' includes a source region 108a' and drain regions 108b'. The active region of the substrate includes a pair of recess holes 110' each formed at a location corresponding to one of the access gates 130a'. Each recess hole 110' is coated with a gate oxide layer 114' and filled with a gate poly layer 120'. Sidewall spacers 150' are formed on sidewalls of the access gates 130a' and the pass gates 130b' and a gate mask 140', which is formed on the access gates 130a' and the pass gates 130b'.

An interlayer dielectric (ILD) oxide 160' is deposited over the field region 100b' of the substrate 100'. A BC SAC 170' is formed in an opening between an access gate 130a' and a pass gate 130b' and a DC SAC 180' is formed in an opening between adjacent access gates 130a'.

In this alternate preferred embodiment of the present invention, recess gate holes 110' are formed to have larger top openings as compared to a bottom thereof than in the preferred embodiment of the present invention. Reference character $W_{O1}$ represents a width of the top opening of the recess gate hole. This larger top opening of the recess gate holes 110' causes an over-etching of the access gates 130a' during the etching to form the access gates 130a' and the pass gates 130b'. Subsequently, when sidewall spacers 150' are formed, the sidewall spacers 150' extend below an upper surface of the substrate 100' and into the recess hole 110'. Accordingly, a width $W'_{A1}$ of the access gate 130a' is made smaller, thereby increasing a distance $BC'_1$ and a distance $DC'_1$ and improving a contact open margin.

A method of forming the DRAM cell gate layout according to the alternate preferred embodiment of the present invention will now be described with reference to FIGS. 6A-6G.

Figure 6A:
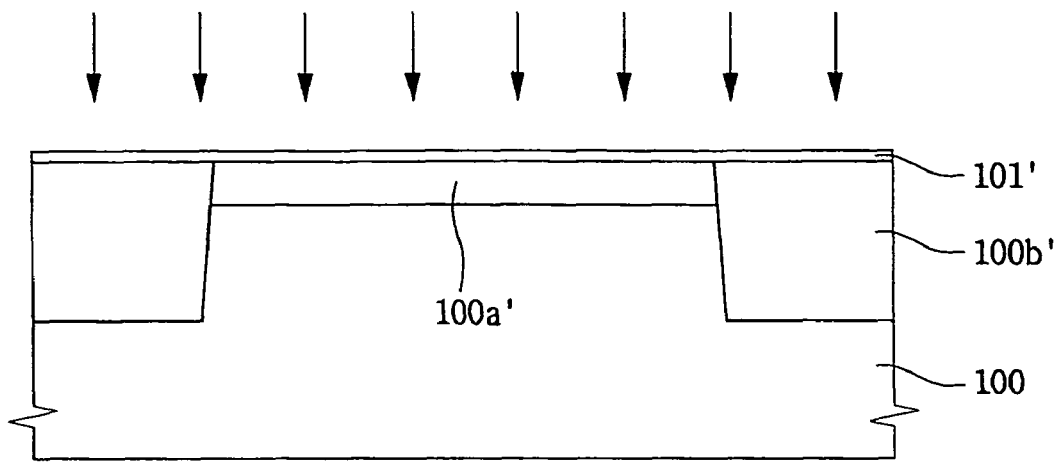
FIGS. 6A-6G illustrate stages in a method of forming the DRAM cell gate layout as shown in FIG. 5.

FIG. 6A illustrates a substrate 100' having an active region 100a' and a field region 100b' for forming a shallow trench isolation (STI) region. A first oxide layer 101' is then formed on the active 100a' and field 100b' regions of the substrate 100'. An ion implantation (shown by arrows) is then preformed to form source/drain regions in the substrate 100'.

Figure 6B:
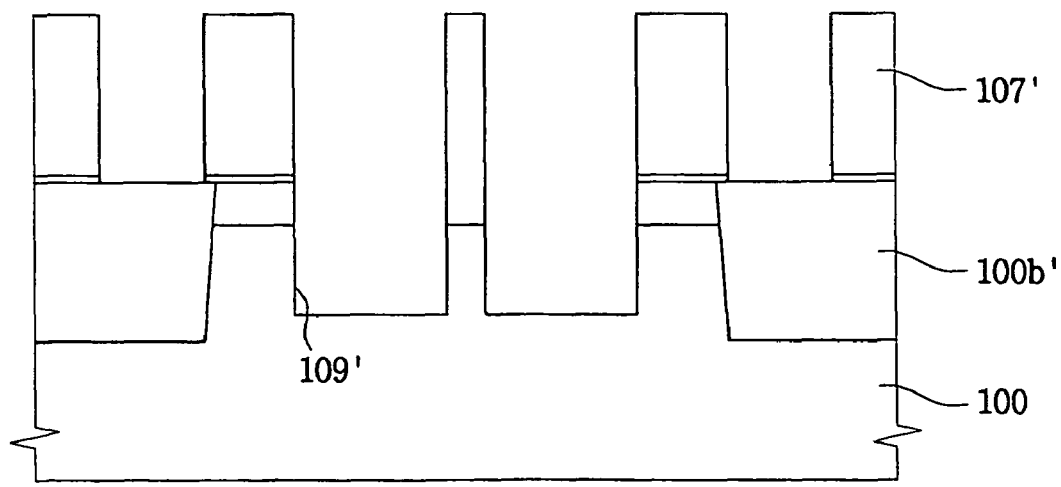

Referring to FIG. 6B, a second oxide layer 107' is formed on the first oxide layer 101'. An etching process is then performed to form a series of gate trenches 109' to serve as gate contacts.

Figure 6C:
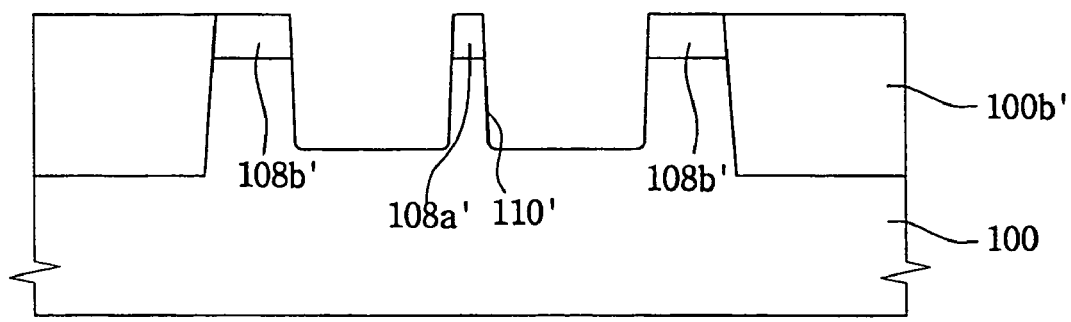

Referring to FIG. 6C, after formation of the gate trenches 109', the second oxide layer 107' and the first oxide layer 101' are removed from the surface of the substrate 100'. Recess gate holes 110' are then formed in the active region 100a' of the substrate 100' between the source region 108a' and the drain regions 108b', respectively, of the substrate 100'.

Figure 6D:
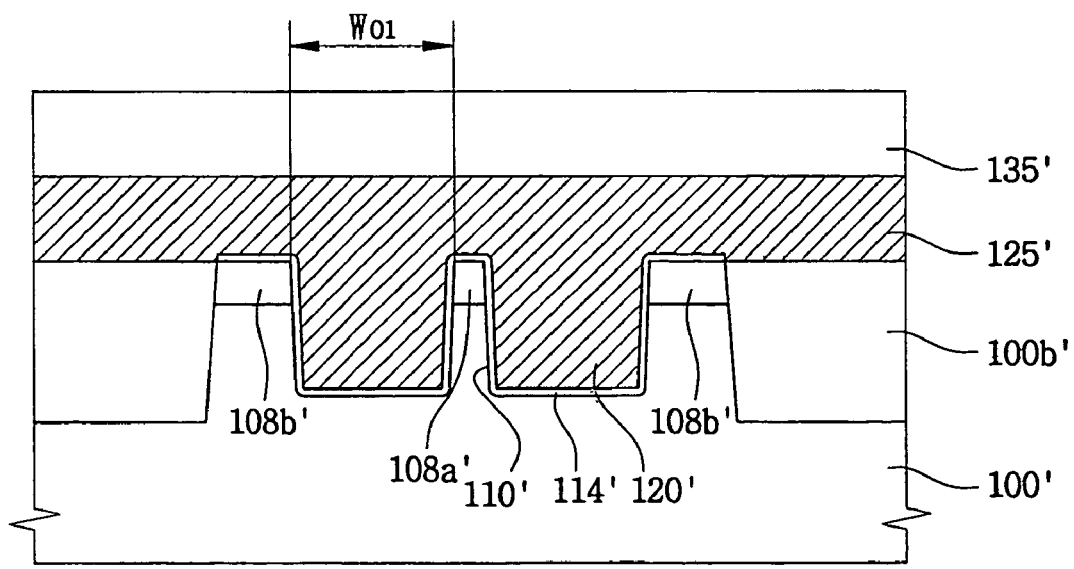

Referring to FIG. 6D, a gate oxide layer 114' is formed on the active region 100a' of the substrate 100'. The gate oxide layer 114' covers an upper surface of the active region 100a' of the substrate 100' and interior surfaces of the recess gate holes 110'. A gate poly layer 125' and a gate mask layer 135' are then sequentially formed on the gate oxide layer 114' and on the field region 100b' of the substrate 100'.

As may be seen in FIG. 6D, the recess gate holes 110' are etched to have larger top openings as compared to a bottom thereof than in the preferred embodiment of the present invention. Reference character $W_{O1}$ represents a width of the top opening of the recess gate hole.

Figure 6E:
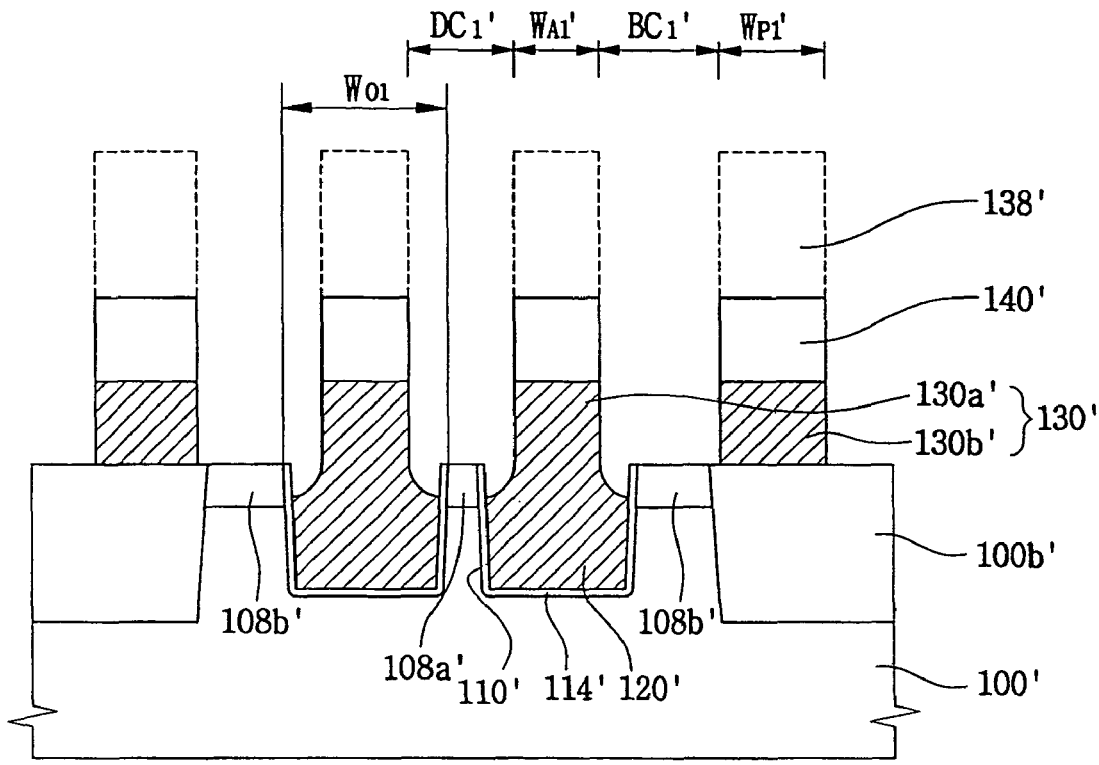

Referring to FIG. 6E, a photoresist layer 138' is formed on the gate poly layer 125' and the gate mask layer 135'. The gate poly layer 125' and the gate mask layer 135' are then etched to form access gates 130a' and gate masks 140' over the active region 100a' of the substrate 100' and pass gates 130b' and gate masks 140' over the field region 100b' of the substrate 100'. Reference characters $W'_{A1}$ and $W'_{P1}$ represent widths of an access gate and a pass gate, respectively. Reference character $BC'_1$ represents a distance between an access gate and a pass gate. Reference character $DC'_1$ represents a distance between adjacent access gates.

During the etching to form the access gates 130a' and the pass gates 130b', the larger top opening of the recess gate holes 110' causes an over-etching of the access gates 130a'. Subsequently, when sidewall spacers (150' of FIG. 6F) are formed, the sidewall spacers 150' extend below an upper surface of the substrate 100' and into the recess hole 110'. Accordingly, a width $W'_{A1}$ of the access gate 130a' is made smaller, thereby increasing a distance $BC'_1$ and a distance $DC'_1$ and improving a contact open margin.

Figure 6F:
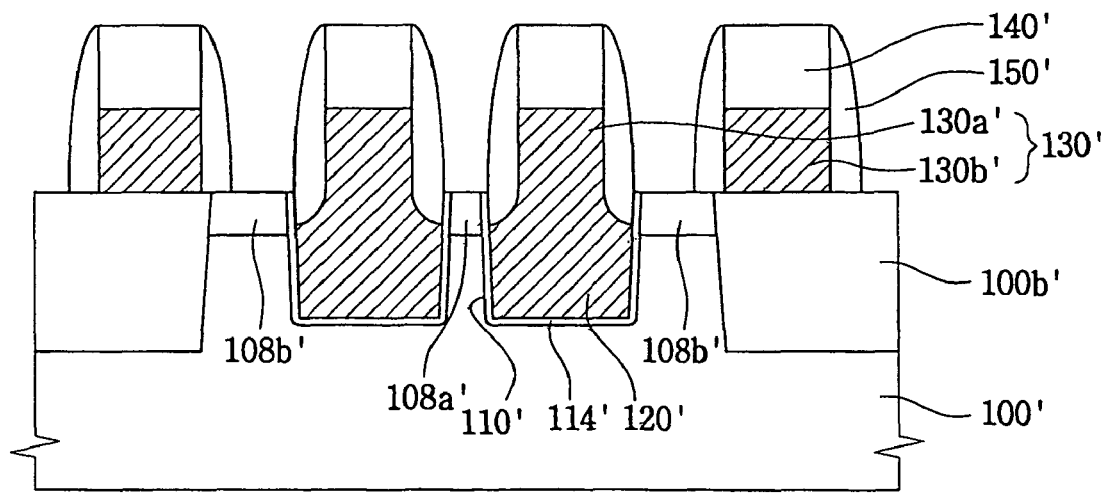

Referring to FIG. 6F, an insulation layer (not shown) is formed on the access gates 130a' and the pass gates 130b' and the substrate 100' by a chemical vapor deposition (CVD) process. The insulation layer is then etched to form sidewall spacers 150' on sidewalls of the access gates and the pass gates. As described above, in view of the over-etching of the access gates 130a', the sidewall spacers 150' extend below an upper surface of the substrate 100'.

Figure 6G:
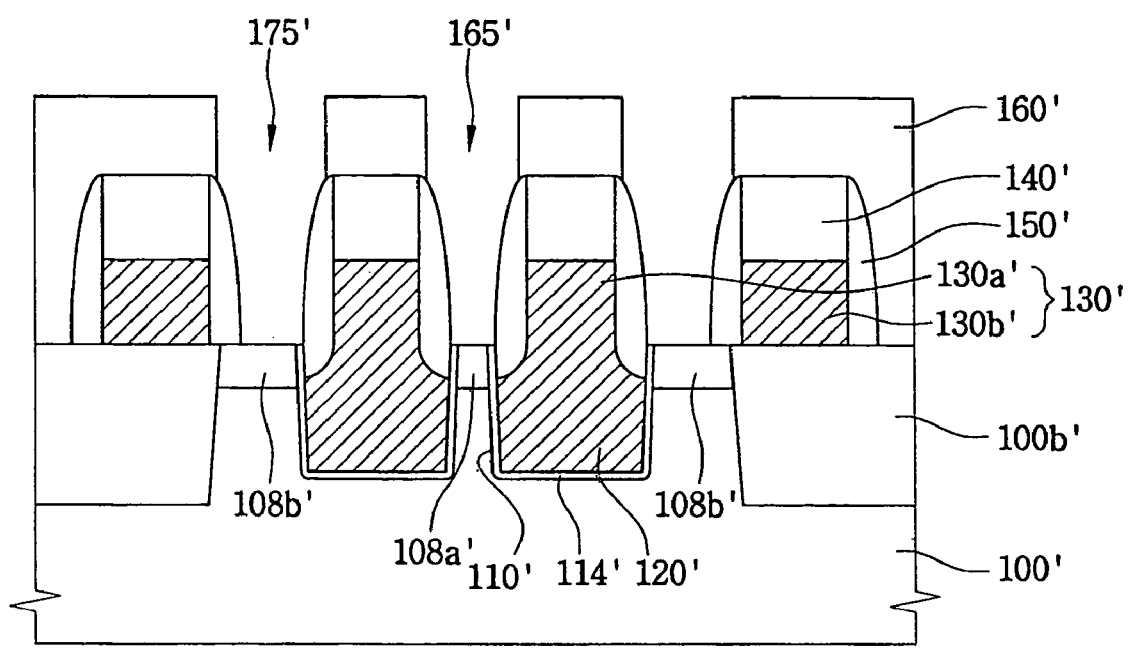

Referring to FIG. 6G, an interlayer dielectric (ILD) oxide 160' is deposited on the access gates 130a' and the pass gates 130b' and the substrate 100'. The interlayer dielectric (ILD) oxide 160' is then etched to form an opening 165' over the active region 100a' of the substrate 100' between adjacent access gates 130a' and openings 175' over the active region 100a' of the substrate 100' between the access gate 130a' and the pass gate 130b'. The opening 175' between an access gate 130a' and a pass gate 130b' forms the BC SAC (170' of FIG. 5). The opening 165' between adjacent access gates 130a' forms the DC SAC (180' of FIG. 5). The interlayer dielectric (ILD) oxide 160', the BC SAC 170', and the DC SAC 180' are then planarized to achieve the resultant structure as shown in FIG. 5.

In the alternate preferred embodiment, due to over-etching of the access gates 130a', the width $W_A'$ of the access gate 130a' is made smaller, thereby increasing a distance BC' and a distance DC'. The increase in the distance BC' and the distance DC' results in an improvement to the contact open margin.

Second Embodiment

Figure 7:
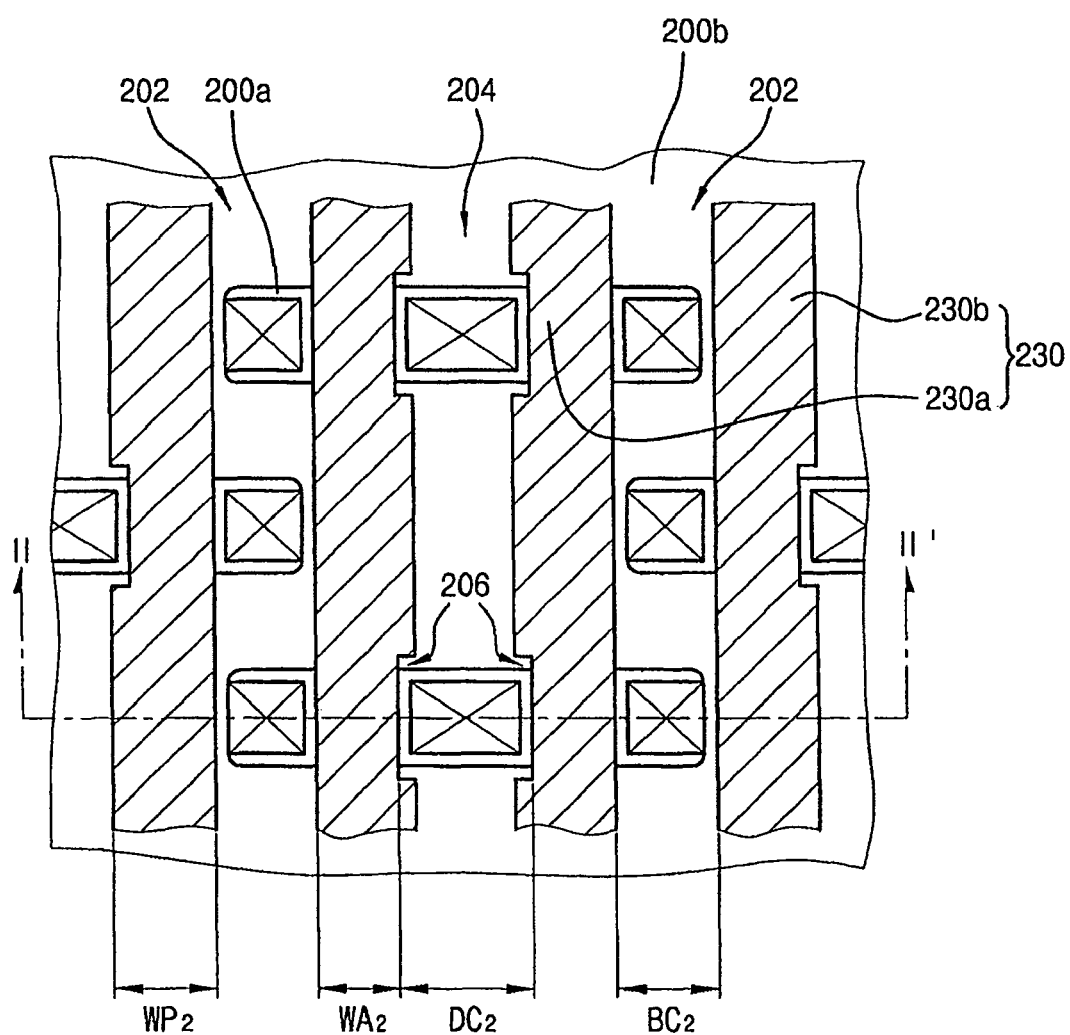
FIG. 7 illustrates a plan view of a DRAM cell gate layout according to a second embodiment of the present invention.
Figure 8:
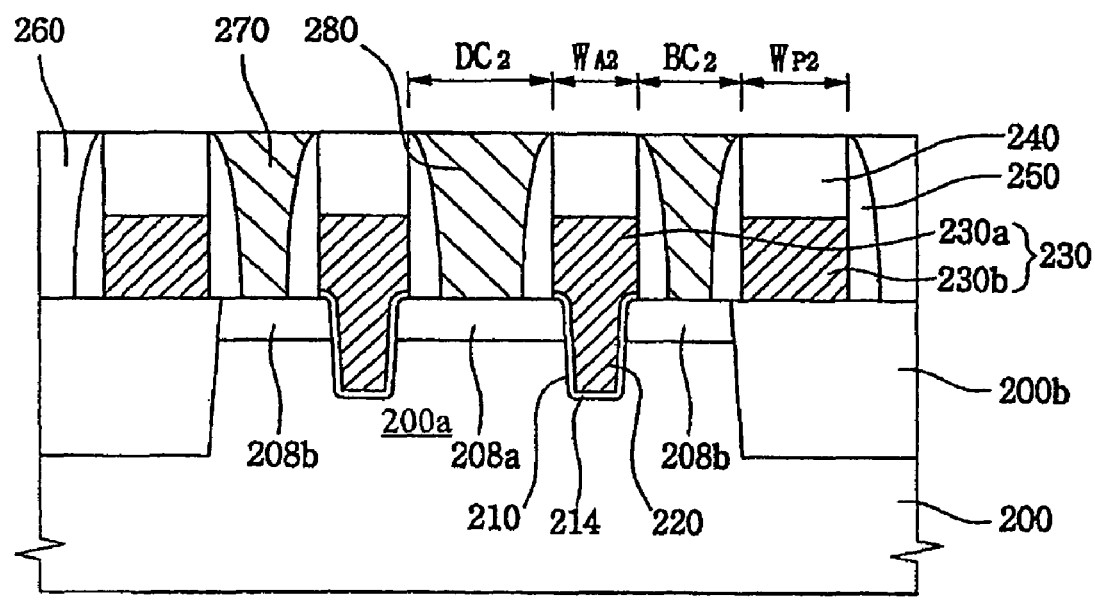
FIG. 8 illustrates a cross-sectional view taken along line II-II' of FIG. 7.

FIG. 7 illustrates a plan view of a DRAM cell gate layout according to a second embodiment of the present invention. FIG. 8 illustrates a cross-sectional view taken along line II-II' of FIG. 7. FIGS. 8A-8G illustrate stages in a method of forming the DRAM cell gate layout as shown in FIGS. 7 and 8.

Referring to FIG. 7, a substrate (200 of FIG. 8) includes an active region 200a and a field region 200b. A gate layer 230 is formed over the substrate to intersect the active region 200a. The gate layer 230 includes an access gate 230a and a pass gate 230b. An access gate 230a is formed over each intersection of the gate layer 230 and the active region 200a. Reference character $W_{A2}$ represents a width of an access gate 230a. A pass gate 230b is formed over each intersection of the gate layer 230 and the field region 200b. Reference character $W_{P2}$ represents a width of a pass gate 230b.

A BC SAC region 202 is formed at a periphery of the active region 200a. Reference character $BC_2$ represents a distance between an access gate 230a and an adjacent pass gate 230b in the BC SAC region. A DC SAC region 204 is formed at a center of the active region 200a. Reference character $DC_2$ represents a distance between adjacent access gates 230a in the DC SAC region.

In the second embodiment of the present invention, the width of the access gates $W_{A2}$ is made smaller than the width of the pass gates $W_{P2}$ by etching notches 206 in sides of the access gates 230a adjacent to the DC SAC region 204. In this embodiment, the notches 206 are etched only on a side of an access gate 230a facing an adjacent access gate 230a, i.e., in the DC SAC region 202. The notches 106 preferably have a depth of between about 10-20 nm.

FIG. 8 illustrates a cross-sectional view taken along line II-II' of FIG. 7. In FIG. 8, a pair of access gates 230a and a pair of pass gates 230b are formed on an active region 200a and a field region 200b of a substrate 200, respectively. The substrate 200 includes a source region 208a and drain regions 208b. The active region of the substrate includes a pair of recess holes 210 each formed at a location corresponding to one of the access gates 230a. Each recess hole 210 is coated with a gate oxide layer 214 and filled with a gate poly layer 220. Sidewall spacers 250 are formed on sidewalls of the access gates 230a and the pass gates 230b and a gate mask 240, which is formed on the access gates 230a and the pass gates 230b.

An interlayer dielectric (ILD) oxide 260 is deposited over the field region 200b of the substrate 200. A BC SAC 270 is formed in an opening between an access gate 230a and a pass gate 230b and a DC SAC 280 is formed in an opening between adjacent access gates 230a.

As in the preferred embodiment, preferably, a ratio of BC SAC region/DC SAC region is a range of approximately 1 to 1.2. Most preferably, the ratio is the golden ration, i.e., about 1.1.

A method of forming the DRAM cell gate layout according to the second embodiment of the present invention will now be described with reference to FIGS. 9A-9G.

Figure 9A:
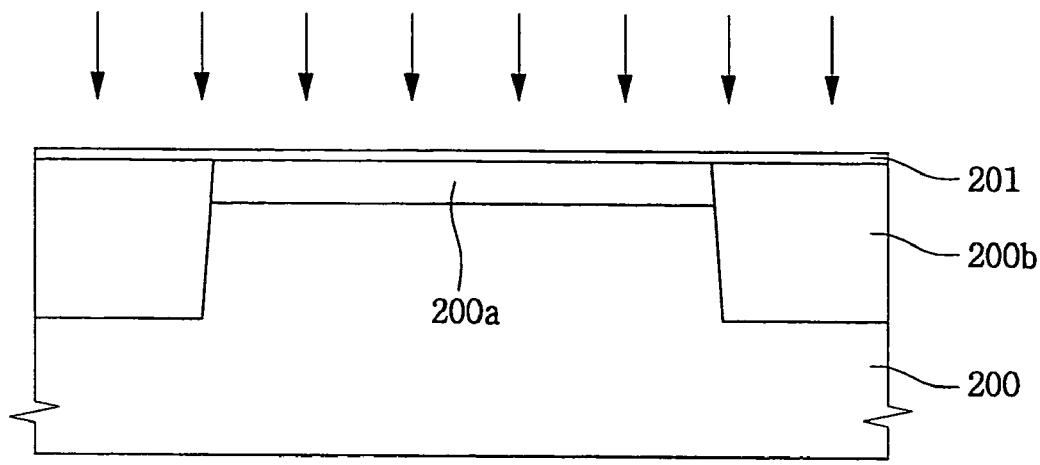
FIGS. 9A-9G illustrate stages in a method of forming the DRAM cell gate layout as shown in FIGS. 7 and 8.

FIG. 9A illustrates a substrate 200 having an active region 200a and a field region 200b for forming a shallow trench isolation (STI) region. A first oxide layer 201 is then formed on the active 200a and field 200b regions of the substrate 200. An ion implantation (shown by arrows) is then preformed to form source/drain regions in the substrate 200.

Figure 9B:
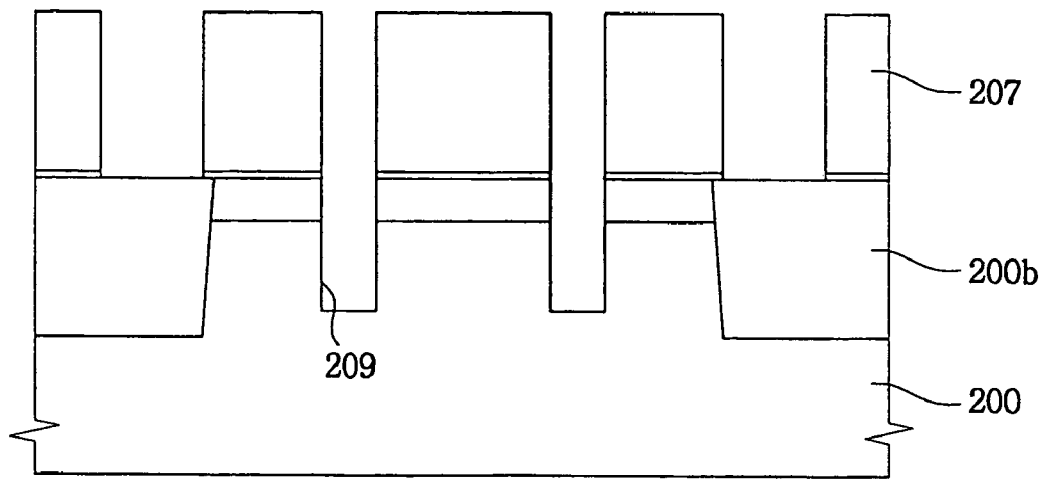

Referring to FIG. 9B, a second oxide layer 207 is formed on the first oxide layer 201. An etching process is then performed to form a series of gate trenches 209 to serve as gate contacts.

Figure 9C:
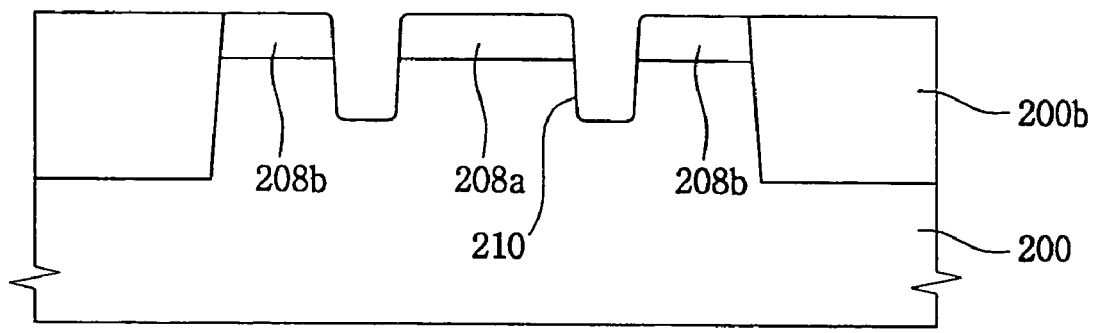

Referring to FIG. 9C, after formation of the gate trenches 209, the second oxide layer 207 and the first oxide layer 201 are removed from the surface of the substrate 200. Recess gate holes 210 are then formed in the active region 200a of the substrate 200 between the source region 208a and the drain regions 208b, respectively, of the substrate 200.

Figure 9D:
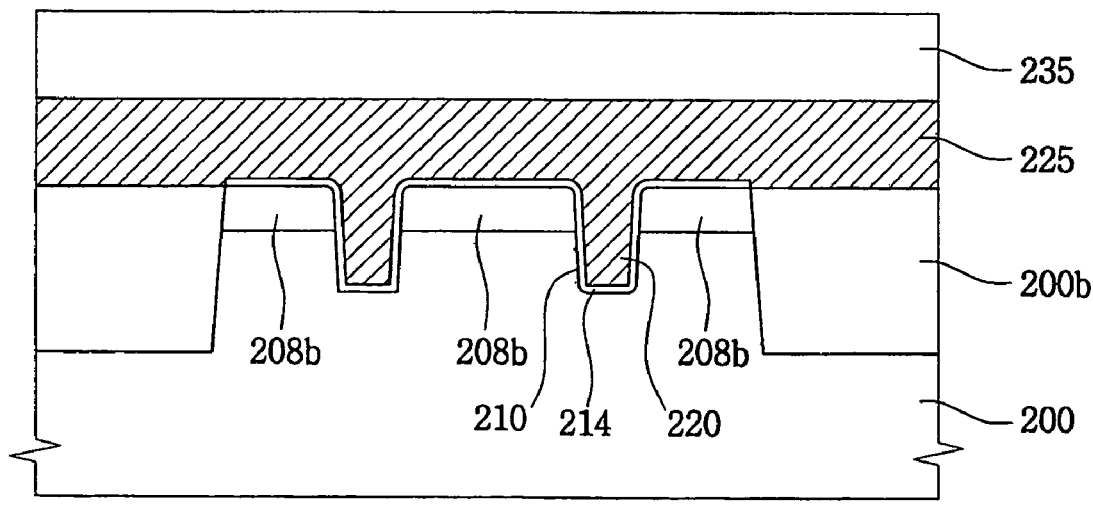

Referring to FIG. 9D, a gate oxide layer 214 is formed on the active region 200a of the substrate 200. The gate oxide layer 214 covers an upper surface of the active region 200a of the substrate 200 and interior surfaces of the recess gate holes 210. A gate poly layer 225 and a gate mask layer 235 are then sequentially formed on the gate oxide layer 214 and on the field region 200b of the substrate 200.

Figure 9E:
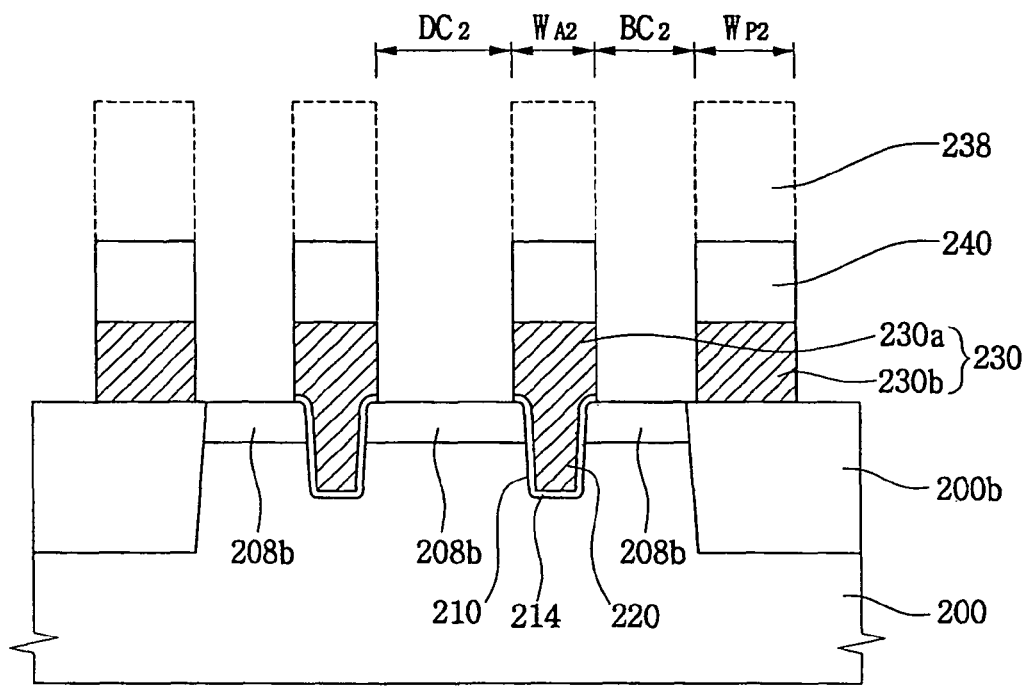

Referring to FIG. 9E, a photoresist layer 238 is formed on the gate poly layer 225 and the gate mask layer 235. The gate poly layer 225 and the gate mask layer 235 are then etched to form access gates 230a and gate masks 240 over the active region 200a of the substrate 200 and pass gates 230b and gate masks 240 over the field region 200b of the substrate 200. Reference characters $W_{A2}$ and $W_{P2}$ represent widths of an access gate and a pass gate, respectively. Reference character $BC_2$ represents a distance between an access gate 230a and a pass gate 230b. Reference character $DC_2$ represents a distance between adjacent access gates 230a.

Figure 9F:
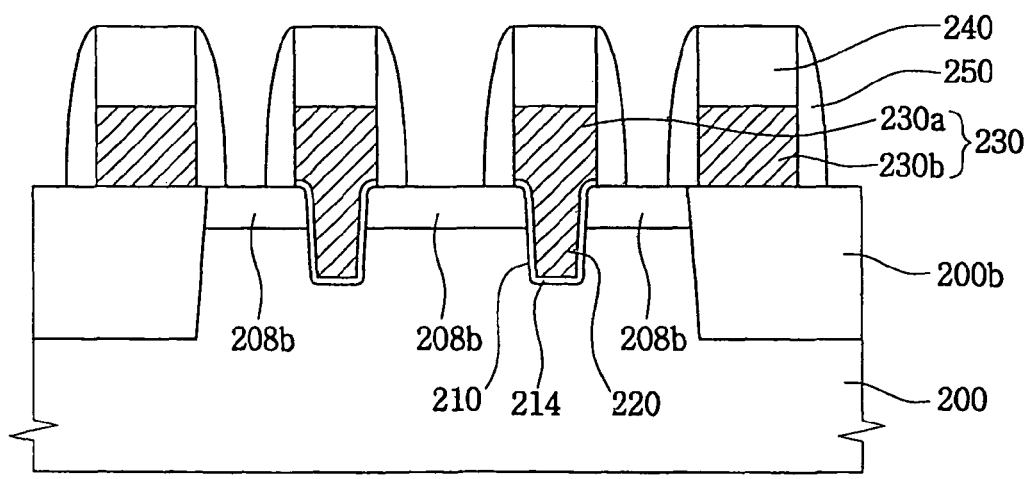

Referring to FIG. 9F, an insulation layer (not shown) is formed on the access gates 230a and the pass gates 230b and the substrate 200 by a chemical vapor deposition (CVD) process. The insulation layer is then etched to form sidewall spacers 250 on sidewalls of the access gates 230a and the pass gates 230b.

Figure 9G:
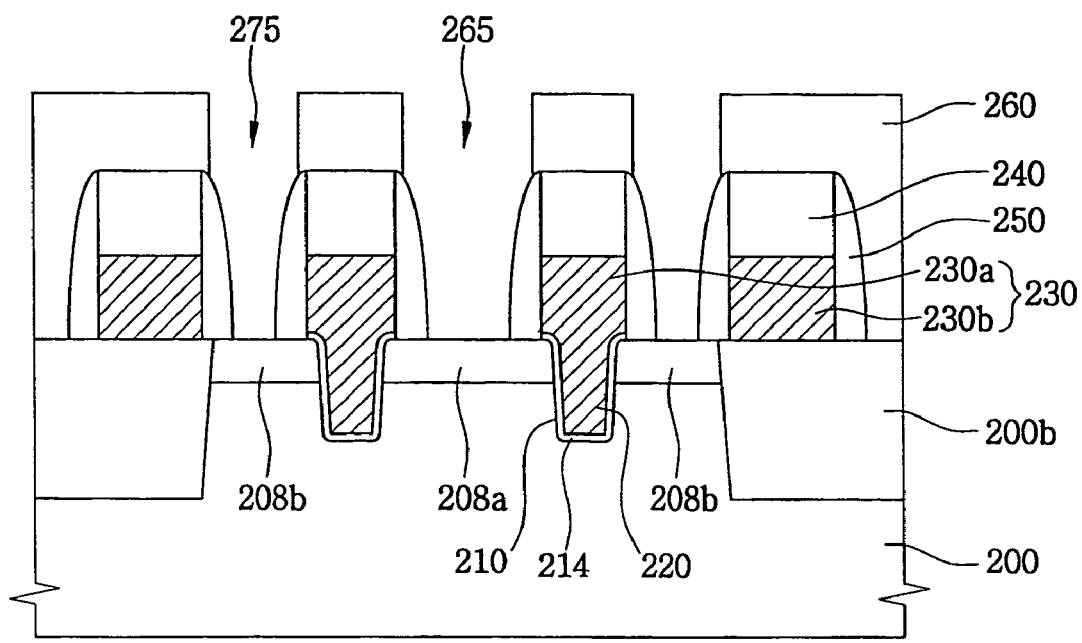

Referring to FIG. 9G, an interlayer dielectric (ILD) oxide 260 is deposited on the access gates 230a and the pass gates 230b and the substrate 200. The interlayer dielectric (ILD) oxide 260 is then etched to form an opening 265 over the active region 200a of the substrate 200 between adjacent access gates 230a and openings 275 over the active region 200a of the substrate 200 between the access gate 230a and the pass gate 230b. The opening 275 between an access gate 230a and a pass gate 230b forms the BC SAC (270 of FIG. 8). The opening 265 between adjacent access gates 230a forms the DC SAC (280 of FIG. 8). The interlayer dielectric (ILD) oxide 260, the BC SAC 270, and the DC SAC 280 are then planarized to achieve the resultant structure as shown in FIG. 8.

Alternate Second Embodiment

Figure 10:
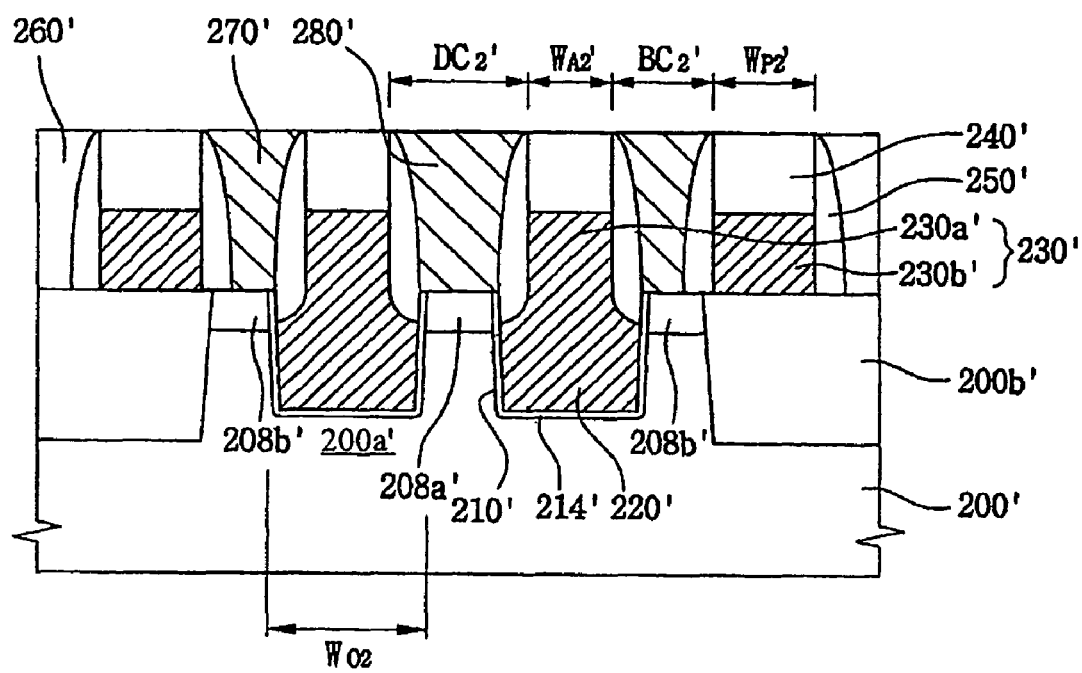
FIG. 10 illustrates an alternate embodiment of the second embodiment as shown in FIGS. 7 and 8.

FIG. 10 illustrates an alternate embodiment of the second embodiment as shown in FIGS. 7 and 8. FIGS. 11A-11G illustrate stages in a method of forming the DRAM cell gate layout as shown in FIG. 10.

In FIG. 10, a pair of access gates 230a' and a pair of pass gates 230b' are formed on an active region 200a' and a field region 200b' of a substrate 200', respectively. The substrate 200' includes a source region 208a' and drain regions 208b'. The active region of the substrate includes a pair of recess holes 210' each formed at a location corresponding to one of the access gates 230a'. Each recess hole 210' is coated with a gate oxide layer 214' and filled with a gate poly layer 220'. Sidewall spacers 250' are formed on sidewalls of the access gates 230a' and the pass gates 230b' and a gate mask 240', which is formed on the access gates 230a' and the pass gates 230b'.

An interlayer dielectric (ILD) oxide 260' is deposited over the field region 200b' of the substrate 200'. A BC SAC 270' is formed in an opening between an access gate 230a' and a pass gate 230b' and a DC SAC 280' is formed in an opening between adjacent access gates 230a'.

In this alternate preferred embodiment of the present invention, recess gate holes 210' are formed to have larger top openings as compared to a bottom thereof than in the preferred embodiment of the present invention. Reference character $W_{O2}$ represents a width of the top opening of the recess gate hole. This larger top opening of the recess gate holes 210' causes an over-etching of the access gates 230a' during the etching to form the access gates 230a' and the pass gates 230b'. Subsequently, when sidewall spacers 250' are formed, the sidewall spacers 250' extend below an upper surface of the substrate 200' and into the recess hole 210'. Accordingly, a width $W'_{A2}$ of the access gate 230a' is made smaller, thereby increasing a distance $BC'_2$ and a distance $DC'_2$ and improving a contact open margin.

A method of forming the DRAM cell gate layout according to the alternate second embodiment of the present invention will now be described with reference to FIGS. 11A-11G.

Figure 11A:
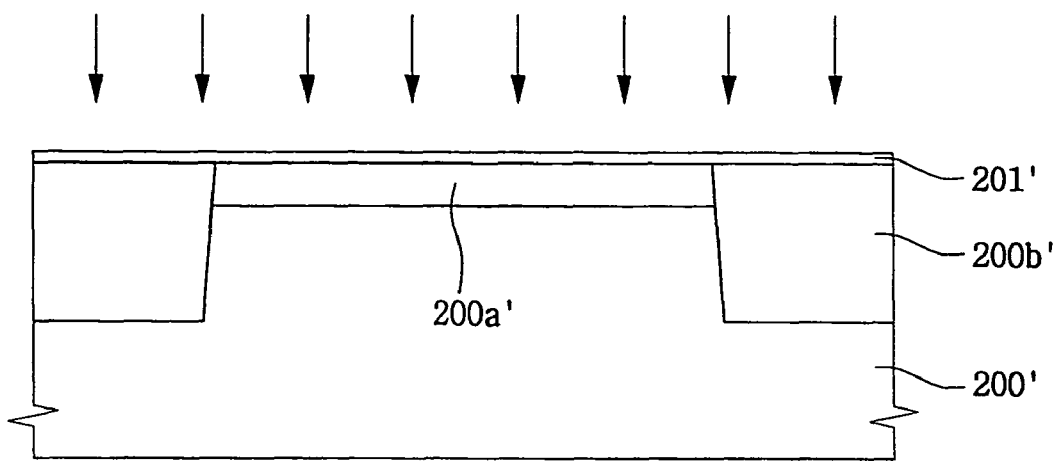
FIGS. 11A-11G illustrate stages in a method of forming the DRAM cell gate layout as shown in FIG. 10.

FIG. 11A illustrates a substrate 200' having an active region 200a' and a field region 200b' for forming a shallow trench isolation (STI) region. A first oxide layer 201' is then formed on the active 200a' and field 200b' regions of the substrate 200'. An ion implantation (shown by arrows) is then preformed to form source/drain regions in the substrate 200'.

Figure 11B:
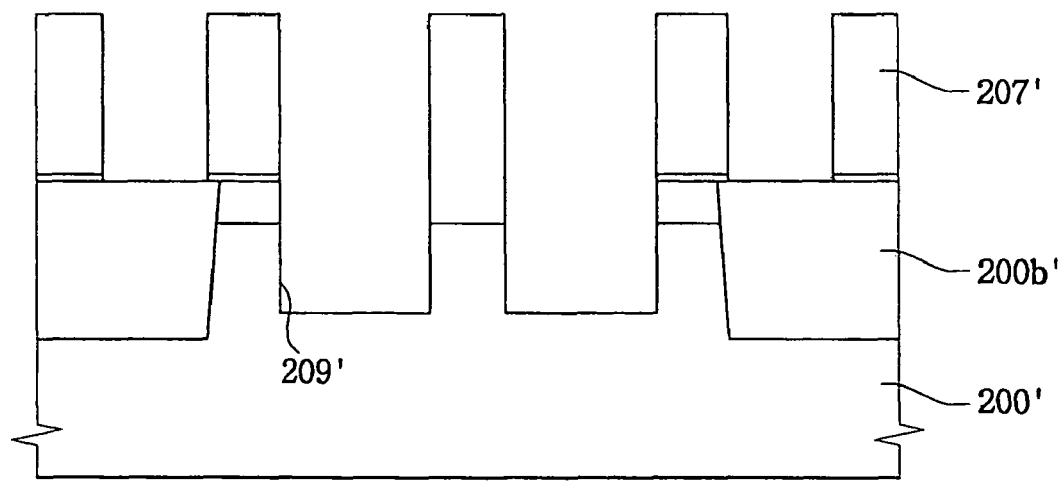

Referring to FIG. 11B, a second oxide layer 207' is formed on the first oxide layer 201'. An etching process is then performed to form a series of gate trenches 209' to serve as gate contacts.

Figure 11C:
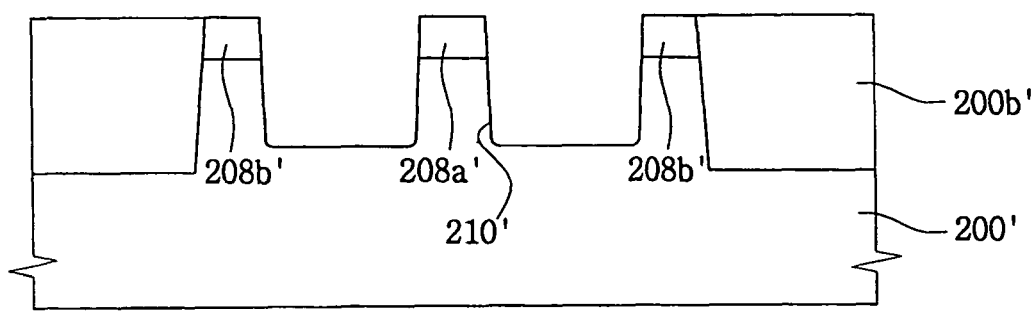

Referring to FIG. 11C, after formation of the gate trenches 209', the second oxide layer 207' and the first oxide layer 201' are removed from the surface of the substrate 200'. Recess gate holes 210' are then formed in the active region 200a' of the substrate 200' between the source region 208a' and the drain regions 208b', respectively, of the substrate 200'.

Figure 11D:
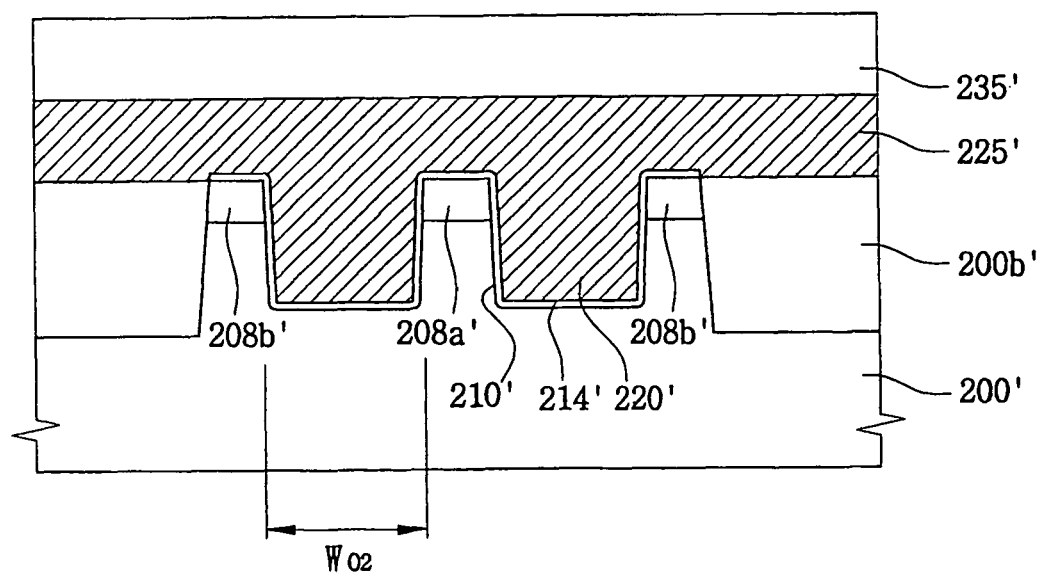

Referring to FIG. 11D, a gate oxide layer 214' is formed on the active region 200a' of the substrate 200'. The gate oxide layer 214' covers an upper surface of the active region 200a' of the substrate 200' and interior surfaces of the recess gate holes 210'. A gate poly layer 225' and a gate mask layer 235' are then sequentially formed on the gate oxide layer 214' and on the field region 200b' of the substrate 200'.

As may be seen in FIG. 11D, the recess gate holes 210' are etched to have larger top openings as compared to a bottom thereof than in the preferred embodiment of the present invention. Reference character $W_{O2}$ represents a width of the top opening of the recess gate hole.

Figure 11E:
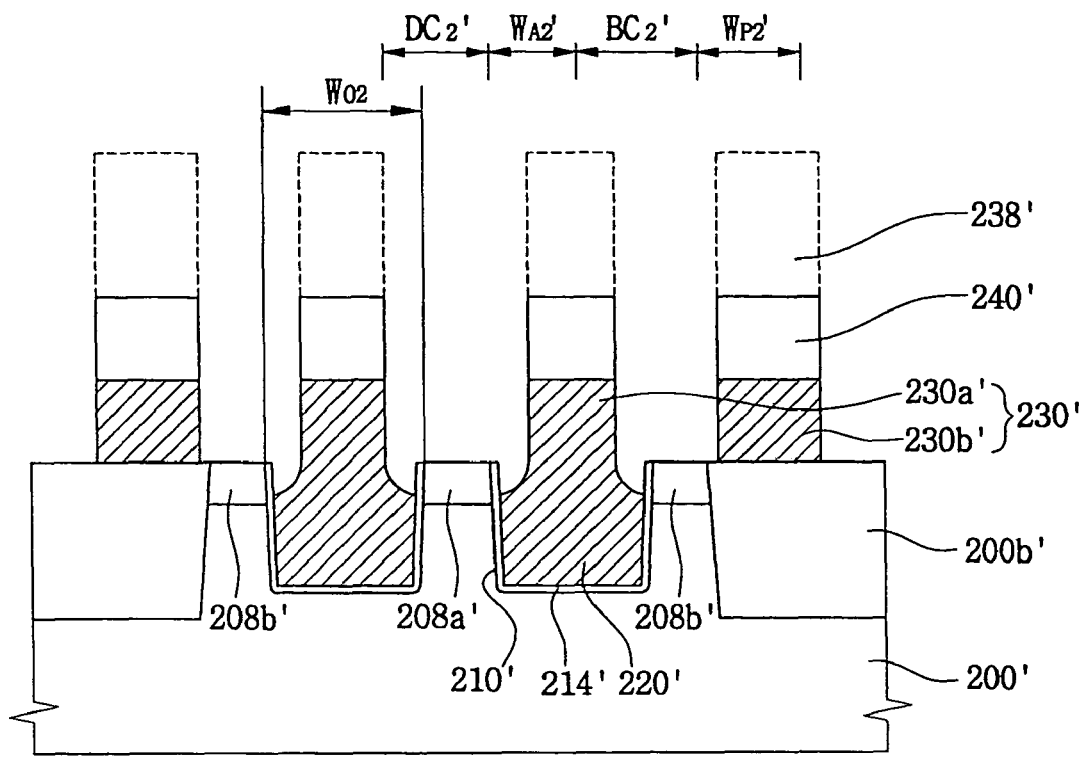

Referring to FIG. 11E, a photoresist layer 238' is formed on the gate poly layer 225' and the gate mask layer 235'. The gate poly layer 225' and the gate mask layer 235' are then etched to form access gates 230a' and gate masks 240' over the active region 200a' of the substrate 200' and pass gates 230b' and gate masks 240' over the field region 200b' of the substrate 200'. Reference characters $W'_{A2}$ and $W'_{P2}$ represent widths of an access gate 230a' and a pass gate 230b', respectively. Reference character $BC'_2$ represents a distance between an access gate 230a' and a pass gate 230b'. Reference character $DC'_2$ represents a distance between adjacent access gates 230a'.

During the etching to form the access gates 230a' and the pass gates 230b', the larger top opening of the recess gate holes 210' causes an over-etching of the access gates 230a'. Subsequently, when sidewall spacers (250' of FIG. 11F) are formed, the sidewall spacers 250' extend below an upper surface of the substrate 200' and into the recess hole 210'. Accordingly, a width $W'_{A2}$ of the access gate 230a' is made smaller, thereby increasing a distance $BC'_2$ and a distance $DC'_2$ and improving a contact open margin.

Figure 11F:
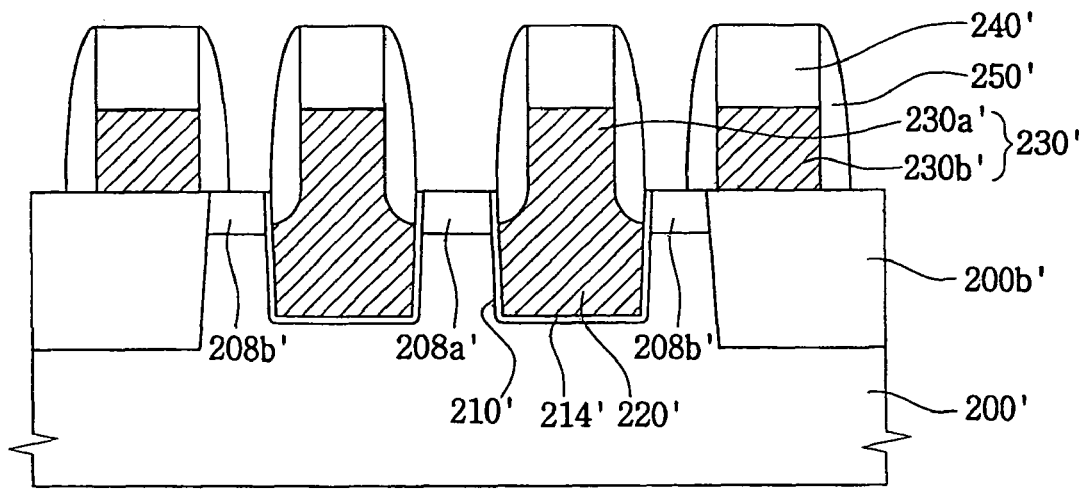

Referring to FIG. 11F, an insulation layer (not shown) is formed on the access gates 230a' and the pass gates 230b' and the substrate 200' by a chemical vapor deposition (CVD) process. The insulation layer is then etched to form sidewall spacers 250' on sidewalls of the access gates and the pass gates. As described above, in view of the over-etching of the access gates 230a', the sidewall spacers 250' extend below an upper surface of the substrate 200'.

Figure 11G:
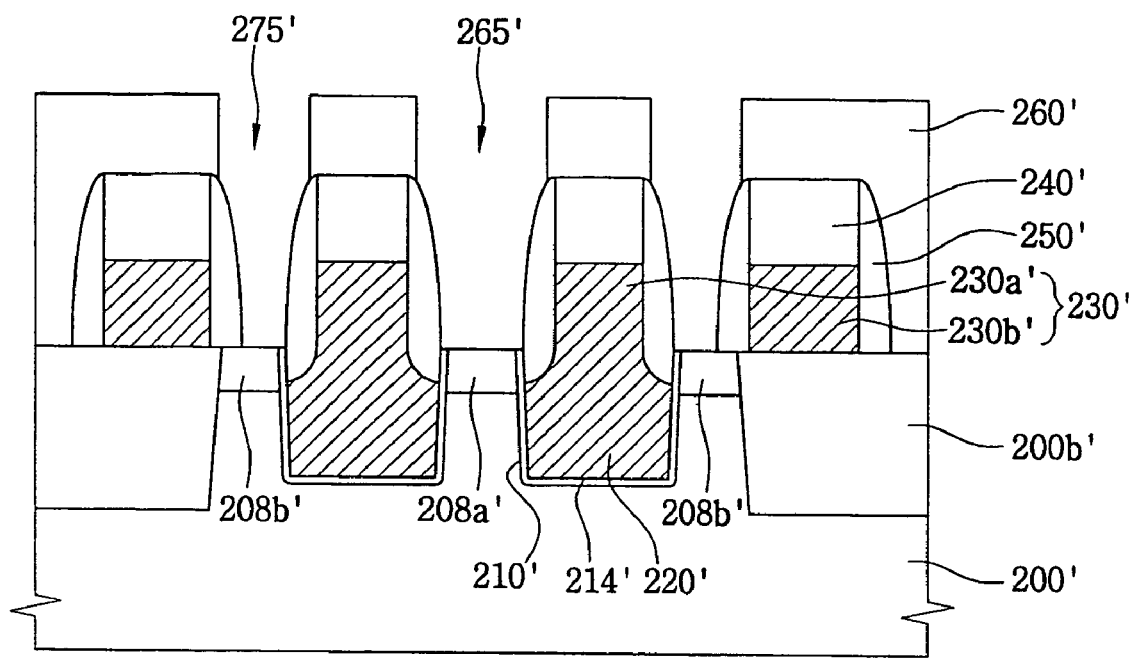

Referring to FIG. 11G, an interlayer dielectric (ILD) oxide 260' is deposited on the access gates 230a' and the pass gates 230b' and the substrate 200'. The interlayer dielectric (ILD) oxide 260' is then etched to form an opening 265' over the active region 200a' of the substrate 200' between adjacent access gates 230a' and openings 275' over the active region 200a' of the substrate 200' between the access gate 230a' and the pass gate 230b'. The opening 275' between an access gate 230a' and a pass gate 230b' forms the BC SAC (270' of FIG. 10). The opening 265' between adjacent access gates 230a' forms the DC SAC (280' of FIG. 10). The interlayer dielectric (ILD) oxide 260', the BC SAC 270', and the DC SAC 280' are then planarized to achieve the resultant structure as shown in FIG. 10.

In the alternate preferred embodiment, due to over-etching of the access gates 230a', the width $W'_{A2}$ of the access gate 230a' is made smaller, thereby increasing a distance $BC'_2$ and a distance $DC'_2$. The increase in the distance $BC'_2$ and the distance $DC'_2$ results in an improvement to the contact open margin.

Third Embodiment

Figure 12:
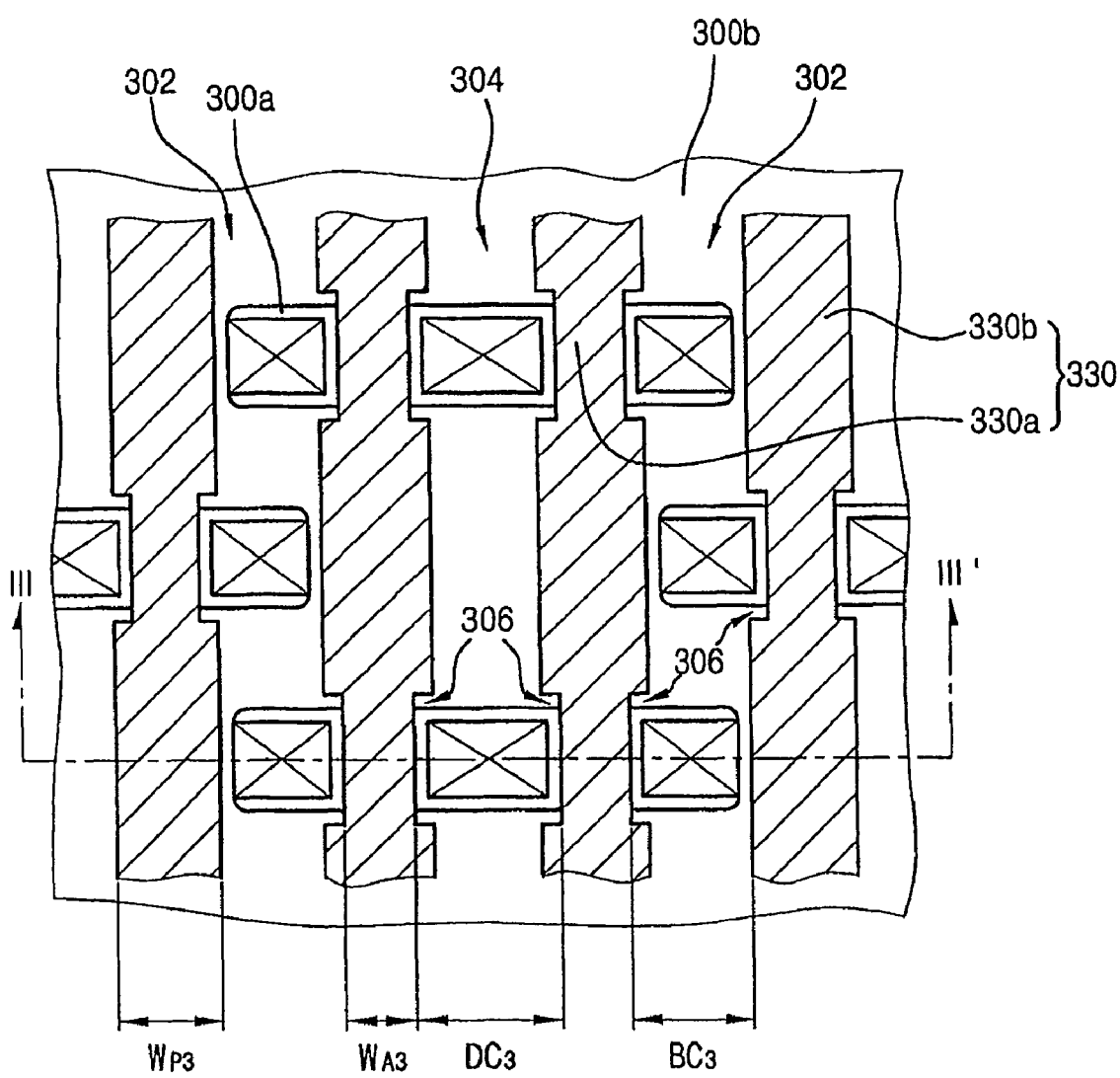
FIG. 12 illustrates a plan view of a DRAM cell gate layout according to a third embodiment of the present invention.
Figure 13:
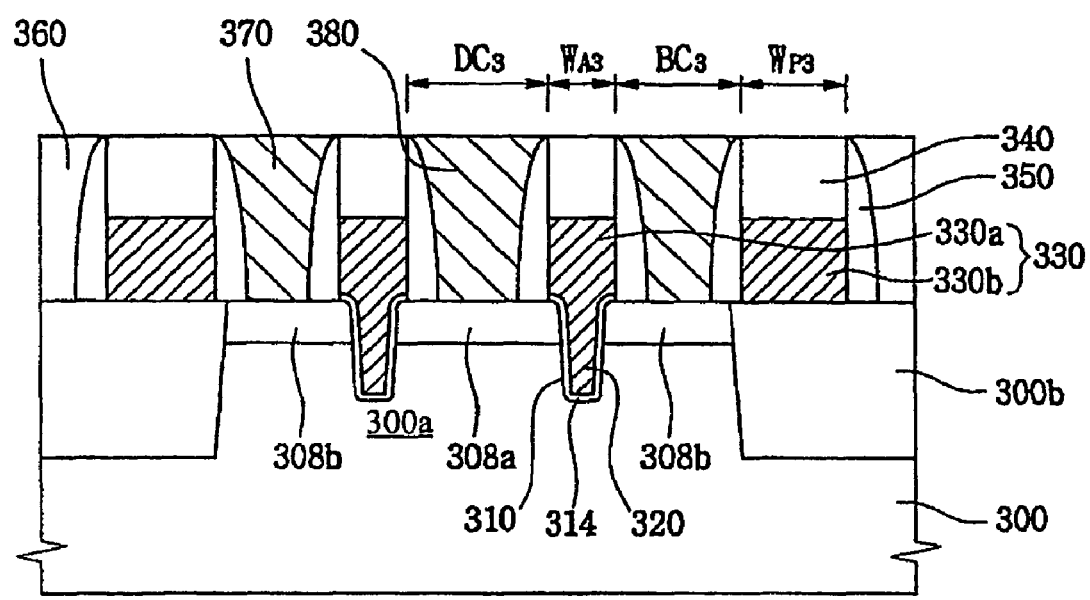
FIG. 13 illustrates a cross-sectional view taken along line III-III' of FIG. 12.

FIG. 12 illustrates a plan view of a DRAM cell gate layout according to a third embodiment of the present invention. FIG. 13 illustrates a cross-sectional view taken along line III-III' of FIG. 12. FIGS. 14A-14G illustrate stages in a method of forming the DRAM cell gate layout as shown in FIGS. 12 and 13.

Referring to FIG. 12, a substrate (300 of FIG. 13) includes an active region 300a and a field region 300b. A gate layer 330 is formed over the substrate to intersect the active region 300a. The gate layer 330 includes an access gate 330a and a pass gate 330b. An access gate 330a is formed over each intersection of the gate layer 330 and the active region 300a. Reference character $W_{A3}$ represents a width of an access gate 330a. A pass gate 330b is formed over each intersection of the gate layer 330 and the field region 300b. Reference character $W_{P3}$ represents a width of a pass gate 330b.

A BC SAC region 302 is formed at a periphery of the active region 300a. Reference character $BC_3$ represents a distance between an access gate 330a and an adjacent pass gate 330b in the BC SAC region. A DC SAC region 304 is formed at a center of the active region 300a. Reference character $DC_3$ represents a distance between adjacent access gates 330a in the DC SAC region.

In the third embodiment of the present invention, the width of the access gates $W_{A3}$ is made smaller than the width of the pass gates $W_{P3}$ by etching notches 306 in both sides of the access gates 330a, i.e., adjacent to the DC SAC region 304 and adjacent to the BC SAC region 302. The third embodiment is a combination of the preferred and the second embodiment in that the notches 306 are etched on a side of an access gate facing an adjacent access gate, i.e., in the DC SAC region 302, and a side of an access gate facing a pass gate, i.e., in the BC SAC region 304. The notches 306 preferably have a depth of between about 10-20 nm.

FIG. 13 illustrates a cross-sectional view taken along line III-III' of FIG. 12. In FIG. 13, a pair of access gates 330a and a pair of pass gates 330b are formed on an active region 300a and a field region 300b of a substrate 300, respectively. The substrate 300 includes a source region 308a and drain regions 308b. The active region of the substrate includes a pair of recess holes 310 each formed at a location corresponding to one of the access gates 330a. Each recess hole 310 is coated with a gate oxide layer 314 and filled with a gate poly layer 320. Sidewall spacers 350 are formed on sidewalls of the access gates 330a and the pass gates 330b and a gate mask 340, which is formed on the access gates 330a and the pass gates 330b.

An interlayer dielectric (ILD) oxide 360 is deposited over the field region 300b of the substrate 300. A BC SAC 370 is formed in an opening between an access gate 330a and a pass gate 330b and a DC SAC 380 is formed in an opening between adjacent access gates 330a.

As in the preferred embodiment, preferably, a ratio of BC SAC region/DC SAC region is a range of approximately 1 to 1.2. Most preferably, the ratio is the golden ration, i.e., about 1.1.

A method of forming the DRAM cell gate layout according to the third embodiment of the present invention will now be described with reference to FIGS. 14A-14G.

Figure 14A:
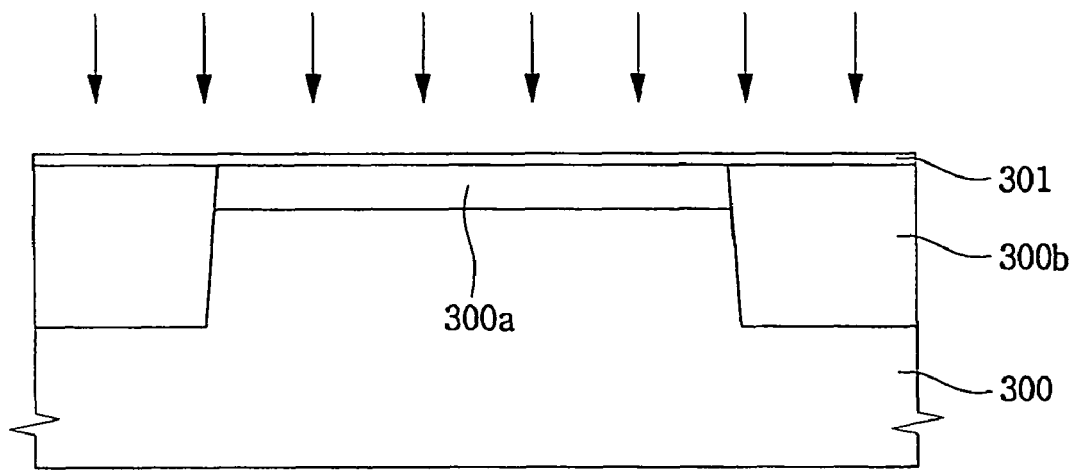
FIGS. 14A-14G illustrate stages in a method of forming the DRAM cell gate layout as shown in FIGS. 12 and 13.

FIG. 14A illustrates a substrate 300 having an active region 300a and a field region 300b for forming a shallow trench isolation (STI) region. A first oxide layer 301 is then formed on the active 300a and field 300b regions of the substrate 300. An ion implantation (shown by arrows) is then preformed to form source/drain regions in the substrate 300.

Figure 14B:
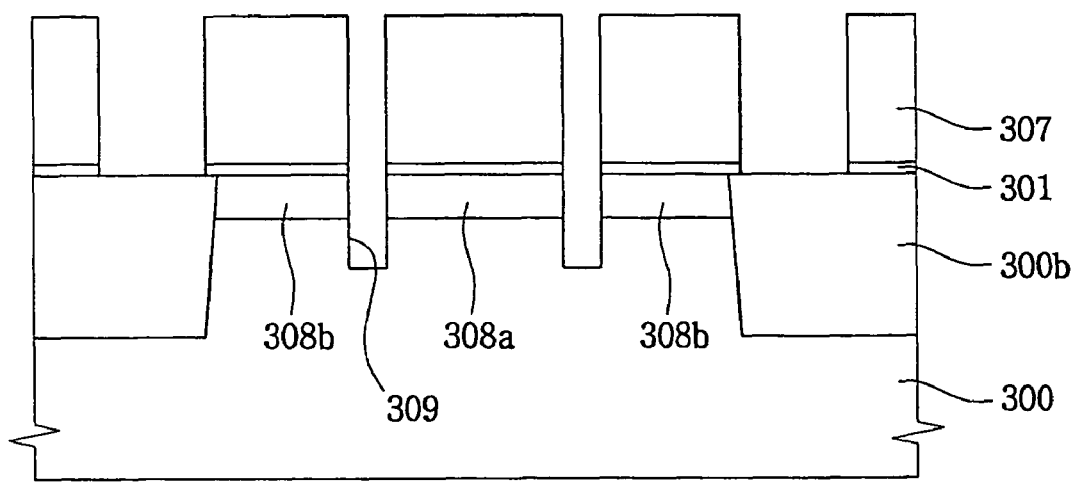

Referring to FIG. 14B, a second oxide layer 307 is formed on the first oxide layer 301. An etching process is then performed to form a series of gate trenches 309 to serve as gate contacts.

Figure 14C:
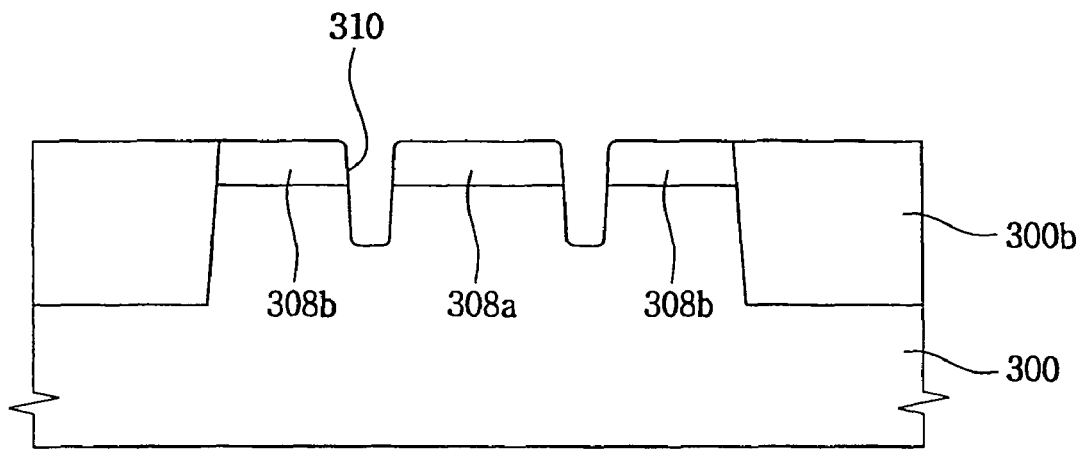

Referring to FIG. 14C, after formation of the gate trenches 309, the second oxide layer 307 and the first oxide layer 301 are removed from the surface of the substrate 300. Recess gate holes 310 are then formed in the active region 300a of the substrate 300 between the source region 308a and the drain regions 308b, respectively, of the substrate 300.

Figure 14D:
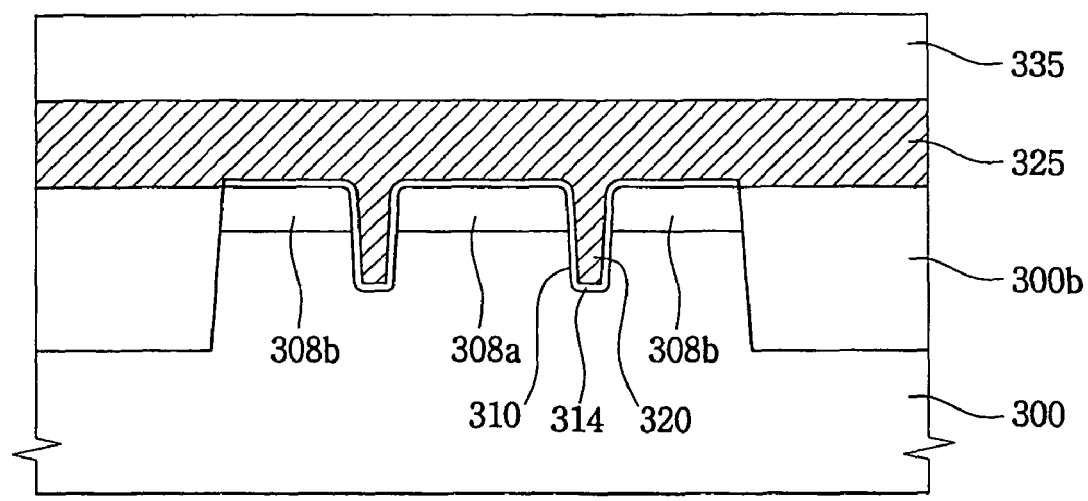

Referring to FIG. 14D, a gate oxide layer 314 is formed on the active region 300a of the substrate 300. The gate oxide layer 314 covers an upper surface of the active region 300a of the substrate 300 and interior surfaces of the recess gate holes 310. A gate poly layer 325 and a gate mask layer 335 are then sequentially formed on the gate oxide layer 314 and on the field region 300b of the substrate 300.

Figure 14E:
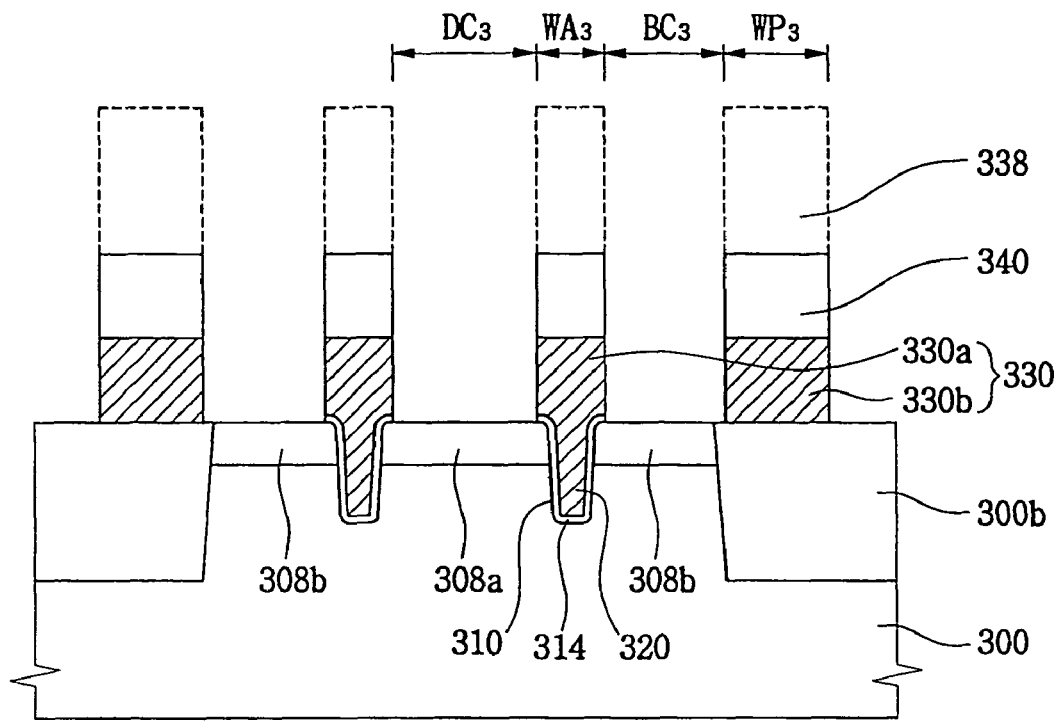

Referring to FIG. 14E, a photoresist layer 338 is formed on the gate poly layer 325 and the gate mask layer 335. The gate poly layer 325 and the gate mask layer 335 are then etched to form access gates 330a and gate masks 340 over the active region 300a of the substrate 300 and pass gates 330b and gate masks 340 over the field region 300b of the substrate 300. Reference characters $W_{A3}$ and $W_{P3}$ represent widths of an access gate and a pass gate, respectively. Reference character $BC_3$ represents a distance between an access gate 330a and a pass gate 330b. Reference character $DC_3$ represents a distance between adjacent access gates 330a.

Figure 14F:
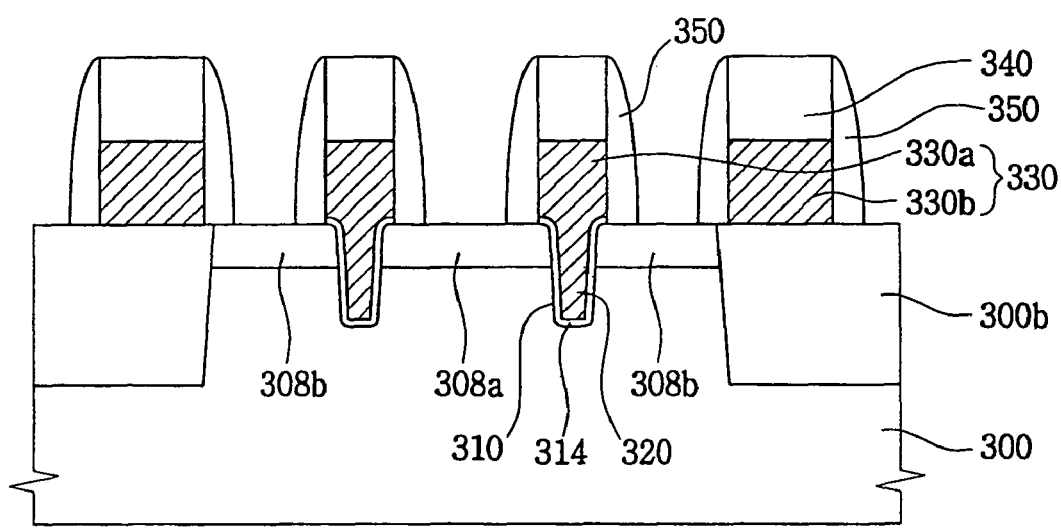

Referring to FIG. 14F, an insulation layer (not shown) is formed on the access gates 330a and the pass gates 330b and the substrate 300 by a chemical vapor deposition (CVD) process. The insulation layer is then etched to form sidewall spacers 350 on sidewalls of the access gates 330a and the pass gates 330b.

Figure 14G:
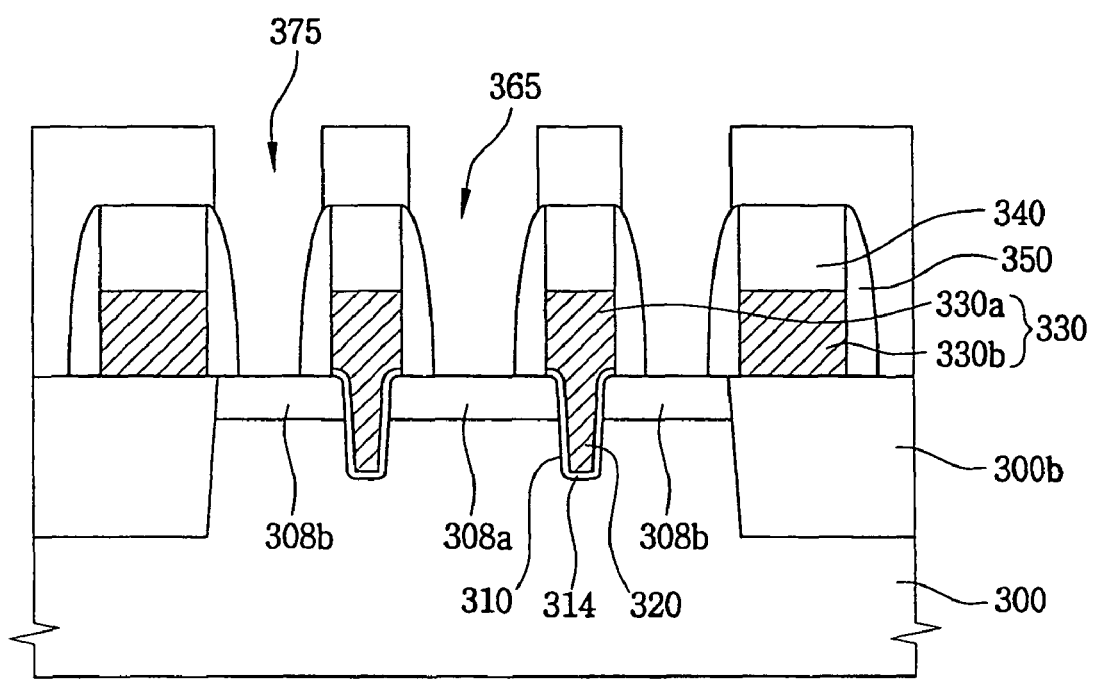

Referring to FIG. 14G, an interlayer dielectric (ILD) oxide 360 is deposited on the access gates 330a and the pass gates 330b and the substrate 300. The interlayer dielectric (ILD) oxide 360 is then etched to form an opening 365 over the active region 300a of the substrate 300 between adjacent access gates 330a and openings 375 over the active region 300a of the substrate 300 between the access gate 330a and the pass gate 330b. The opening 375 between an access gate 330a and a pass gate 330b forms the BC SAC (370 of FIG. 13). The opening 365 between adjacent access gates 330a forms the DC SAC (380 of FIG. 13). The interlayer dielectric (ILD) oxide 360, the BC SAC 370, and the DC SAC 380 are then planarized to achieve the resultant structure as shown in FIG. 13.

Alternate Third Embodiment

Figure 15:
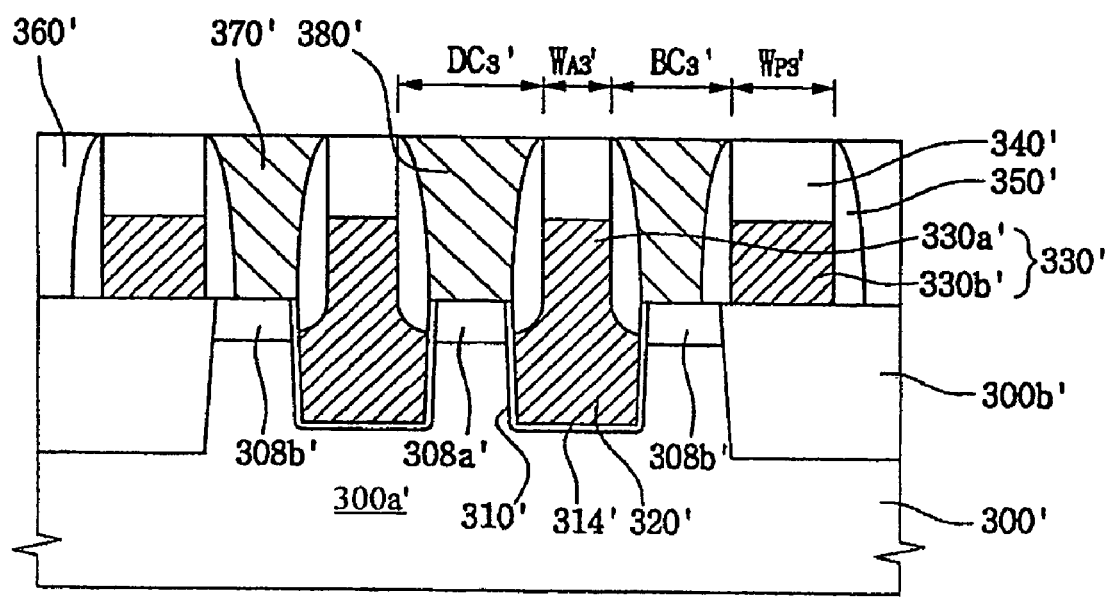
FIG. 15 illustrates an alternate embodiment of the third embodiment as shown in FIGS. 12 and 13.

FIG. 15 illustrates an alternate embodiment of the third embodiment of the present invention. FIGS. 16A-16G illustrate stages in a method of forming the DRAM cell gate layout as shown in FIG. 15.

In FIG. 15, a pair of access gates 330a' and a pair of pass gates 330b' are formed on an active region 300a' and a field region 300b' of a substrate 300', respectively. The substrate 300' includes a source region 308a' and drain regions 308b'. The active region of the substrate includes a pair of recess holes 310' each formed at a location corresponding to one of the access gates 330a'. Each recess hole 310' is coated with a gate oxide layer 314' and filled with a gate poly layer 320'. Sidewall spacers 350' are formed on sidewalls of the access gates 330a' and the pass gates 330b' and a gate mask 340', which is formed on the access gates 330a' and the pass gates 330b'.

An interlayer dielectric (ILD) oxide 360' is deposited over the field region 300b' of the substrate 300'. A BC SAC 370' is formed in an opening between an access gate 330a' and a pass gate 330b' and a DC SAC 380' is formed in an opening between adjacent access gates 330a'.

In this alternate preferred embodiment of the present invention, recess gate holes 310' are formed to have larger top openings as compared to a bottom thereof than in the preferred embodiment of the present invention. Reference character $W_{O3}$ represents a width of the top opening of the recess gate hole. This larger top opening of the recess gate holes 310' causes an over-etching of the access gates 330a' during the etching to form the access gates 330a' and the pass gates 330b'. Subsequently, when sidewall spacers 350' are formed, the sidewall spacers 350' extend below an upper surface of the substrate 300' and into the recess hole 310'. Accordingly, a width $W'_{A3}$ of the access gate 330a' is made smaller, thereby increasing a distance $BC'_3$ and a distance $DC'_3$ and improving a contact open margin.

A method of forming the DRAM cell gate layout according to the alternate third embodiment of the present invention will now be described with reference to FIGS. 16A-16G.

Figure 16A:
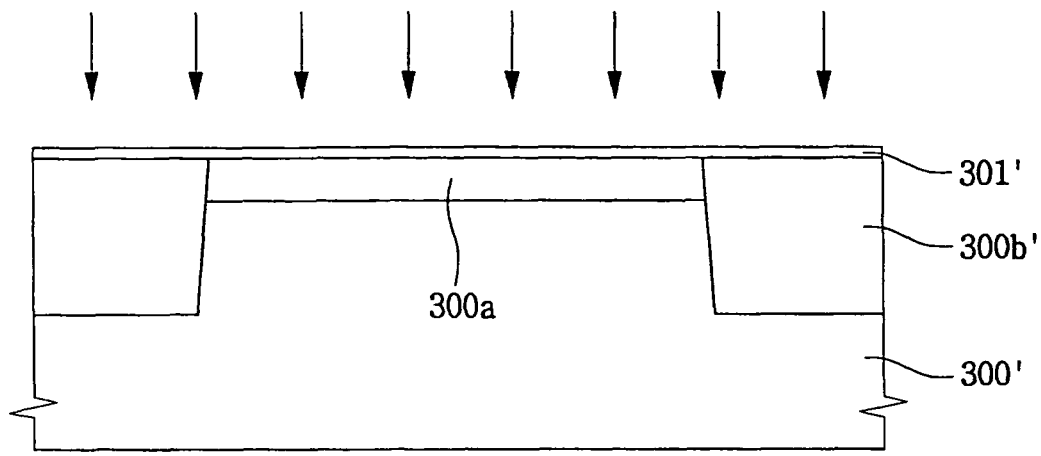
FIGS. 16A-16G illustrate stages in a method of forming the DRAM cell gate layout as shown in FIG. 15.

FIG. 16A illustrates a substrate 300' having an active region 300a' and a field region 300b' for forming a shallow trench isolation (STI) region. A first oxide layer 301' is then formed on the active 300a' and field 300b' regions of the substrate 300'. An ion implantation (shown by arrows) is then preformed to form source/drain regions in the substrate 300'.

Figure 16B:
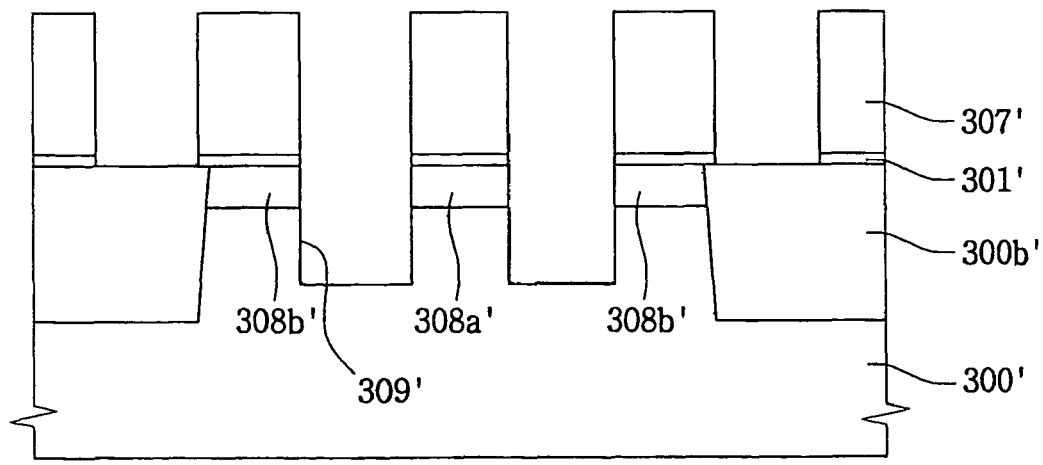

Referring to FIG. 16B, a second oxide layer 307' is formed on the first oxide layer 301'. An etching process is then performed to form a series of gate trenches 309' to serve as gate contacts.

Figure 16C:
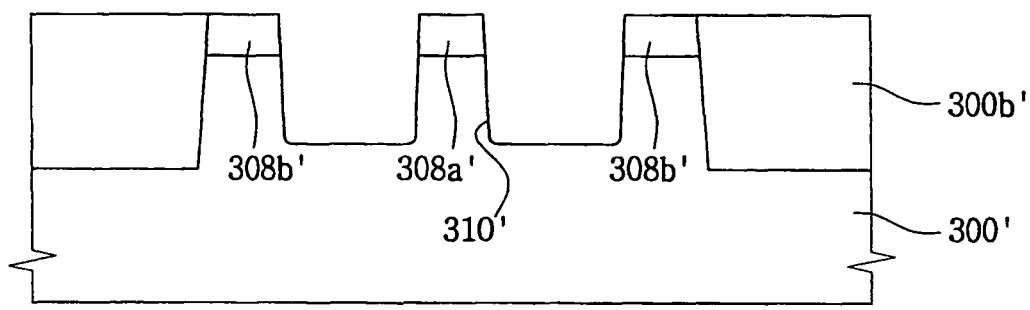

Referring to FIG. 16C, after formation of the gate trenches 309', the second oxide layer 307' and the first oxide layer 301' are removed from the surface of the substrate 300'. Recess gate holes 310' are then formed in the active region 300a' of the substrate 300' between the source region 308a' and the drain regions 308b', respectively, of the substrate 300'.

Figure 16D:
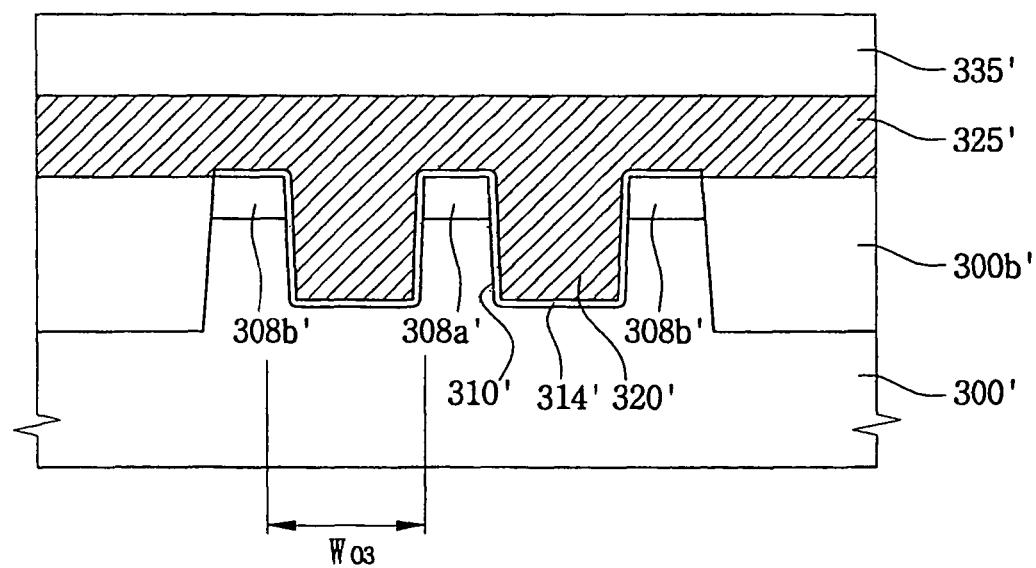

Referring to FIG. 16D, a gate oxide layer 314' is formed on the active region 300a' of the substrate 300'. The gate oxide layer 314' covers an upper surface of the active region 300a' of the substrate 300' and interior surfaces of the recess gate holes 310'. A gate poly layer 325' and a gate mask layer 335' are then sequentially formed on the gate oxide layer 314' and on the field region 300b' of the substrate 300'.

As may be seen in FIG. 16D, the recess gate holes 310' are etched to have larger top openings as compared to a bottom thereof than in the preferred embodiment of the present invention. Reference character $W_{O3}$ represents a width of the top opening of the recess gate hole.

Figure 16E:
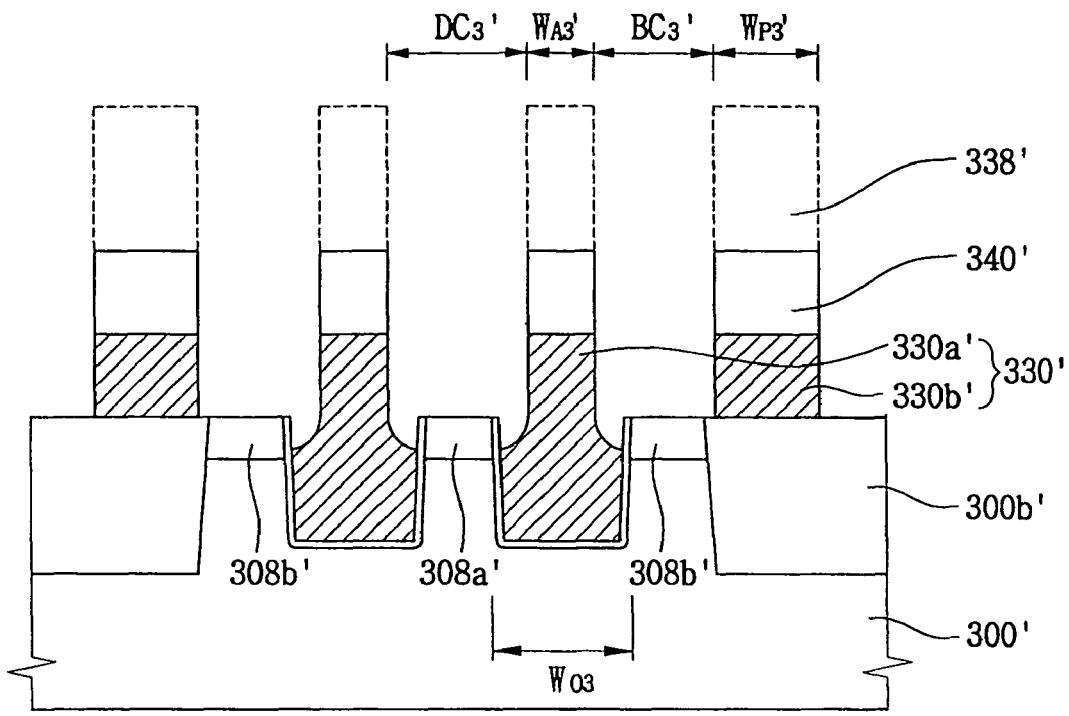

Referring to FIG. 16E, a photoresist layer 338' is formed on the gate poly layer 325' and the gate mask layer 335'. The gate poly layer 325' and the gate mask layer 335' are then etched to form access gates 330a' and gate masks 340' over the active region 300a' of the substrate 300' and pass gates 330b' and gate masks 340' over the field region 300b' of the substrate 300'. Reference characters $W'_{A3}$ and $W'_{P3}$ represent widths of an access gate 330a' and a pass gate 330b', respectively. Reference character $BC'_3$ represents a distance between an access gate 330a' and a pass gate 330b'. Reference character $DC'_3$ represents a distance between adjacent access gates 330a'.

During the etching to form the access gates 330a' and the pass gates 330b', the larger top opening of the recess gate holes 310' causes an over-etching of the access gates 330a'. Subsequently, when sidewall spacers (350' of FIG. 16F) are formed, the sidewall spacers 350' extend below an upper surface of the substrate 300' and into the recess hole 310'. Accordingly, a width $W'_{A3}$ of the access gate 330a' is made smaller, thereby increasing a distance $BC'_3$ and a distance $DC'_3$ and improving a contact open margin.

Figure 16F:
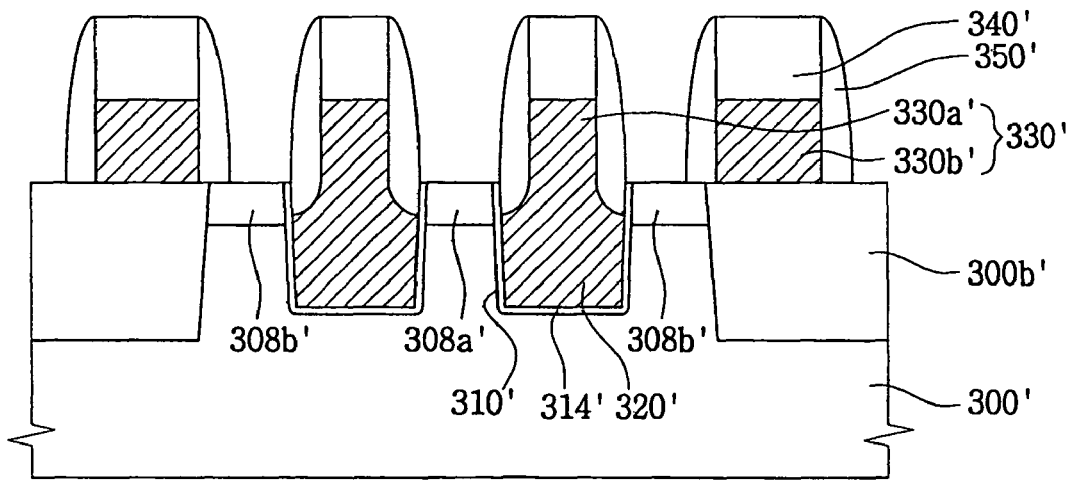

Referring to FIG. 16F, an insulation layer (not shown) is formed on the access gates 330a' and the pass gates 330b' and the substrate 300' by a chemical vapor deposition (CVD) process. The insulation layer is then etched to form sidewall spacers 350' on sidewalls of the access gates and the pass gates. As described above, in view of the over-etching of the access gates 330a', the sidewall spacers 350' extend below an upper surface of the substrate 300'.

Figure 16G:
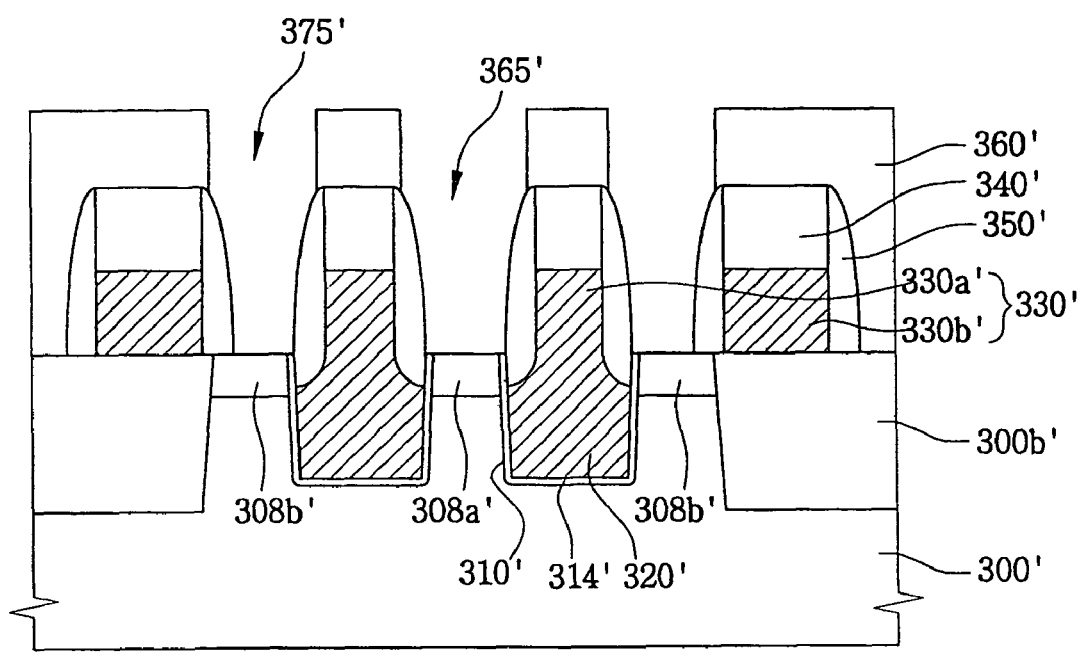

Referring to FIG. 16G, an interlayer dielectric (ILD) oxide 360' is deposited on the access gates 330a' and the pass gates 330b' and the substrate 300'. The interlayer dielectric (ILD) oxide 360' is then etched to form an opening 365' over the active region 300a' of the substrate 300' between adjacent access gates 330a' and openings 375' over the active region 300a' of the substrate 300' between the access gate 330a' and the pass gate 330b'. The opening 375' between an access gate 330a' and a pass gate 330b' forms the BC SAC (370' of FIG. 15). The opening 365' between adjacent access gates 330a' forms the DC SAC (380' of FIG. 15). The interlayer dielectric (ILD) oxide 360', the BC SAC 370', and the DC SAC 380' are then planarized to achieve the resultant structure as shown in FIG. 15.

In the alternate third embodiment, due to over-etching of the access gates 330a', the width $W'_{A3}$ of the access gate 330a' is made smaller, thereby increasing a distance $BC'_3$ and a distance $DC'_3$. The increase in the distance $BC'_3$ and the distance $DC'_3$ results in an improvement to the contact open margin.

Preferred and alternate embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory cell of a semiconductor device comprising:
   a substrate including active regions and field regions;
   a gate layer formed on the substrate, the gate layer including a plurality of access gates formed on the active regions and a plurality of pass gates formed on the field regions, wherein each of the pass gates has a width larger than a width of a corresponding adjacent access gate, and wherein each of the access gates has a width decreased by a notch formed on at least one side of each of the access gates;
   first self-aligned contact regions formed between adjacent pass gates and access gates; and
   second self-aligned contact regions formed between adjacent access gates.

2. The memory cell of a semiconductor device as claimed in claim 1, wherein the notch has a depth of about 10 nm to about 20 nm.

3. The memory cell of a semiconductor device as claimed in claim 1, wherein the notch is positioned adjacent to the second self-aligned contact region so as to face with one of the pass gates.

4. The memory cell of a semiconductor device as claimed in claim 1, further comprising sidewall spacers formed on sidewalls of each of the access gates and each of the pass gates.

5. The memory cell of a semiconductor device as claimed in claim 4, further comprising a recess hole having an opening and a bottom for receiving one of the access gates, wherein a width of the opening of the recess hole is larger than a width of the bottom of the recess hole.

6. The memory cell of a semiconductor device as claimed in claim 1, wherein each of the access gates comprises a pair of notches formed on the opposites side of each of the access gates.

7. The memory cell of a semiconductor device as claimed in claim 6, wherein each of the notches has a depth of about 10 nm to about 20 nm.

8. The memory cell of a semiconductor device as claimed in claim 6, further comprising sidewall spacers formed on sidewalls of each of the access gates and each of the pass gates.

9. The memory cell of a semiconductor device as claimed in claim 8, further comprising a recess hole having an opening and a bottom for receiving one of the access gates, wherein a width of the opening of the recess hole is larger than a width of the bottom of the recess hole.

10. The memory cell of a semiconductor device as claimed in claim 1, wherein each of the first self-aligned contact regions has a width larger than a width of each of the second self-aligned contact regions.

11. The memory cell of a semiconductor device as claimed in claim 10, wherein a ratio between the width of each of the first self-aligned contact regions and the width of each of the second self-aligned contact regions is in a range of about 1.0 to 1.2:1.0.

12. The memory cell of a semiconductor device as claimed in claim 1, further comprising sidewall spacers formed on sidewalls of each of the access gates and each of the pass gates.

13. The memory cell of a semiconductor device as claimed in claim 12, further comprising a recess hole having an opening and a bottom for receiving one of the access gates, wherein a width of the opening of the recess hole is larger than the width of the bottom of the recess hole.

14. The memory cell of a semiconductor as claimed in claim 13, wherein the sidewall spacers formed on the sidewalls of the access gates extend below an upper surface of the substrate.

15. The memory cell of a semiconductor device as claimed in claim 12, further comprising an interlayer dielectric layer formed on the sidewall spacers positioned on a sidewall of one of the pass gates and the field region.

* * * * *